(12) United States Patent
Lu et al.

(10) Patent No.: US 8,884,285 B2
(45) Date of Patent: Nov. 11, 2014

(54) MULTIFUNCTIONAL ZINC OXIDE NANO-STRUCTURE-BASED CIRCUIT BUILDING BLOCKS FOR RE-CONFIGURABLE ELECTRONICS AND OPTOELECTRONICS

(71) Applicants: Yicheng Lu, East Brunswick, NJ (US); Yang Zhang, Piscataway, NJ (US); Chieh-Jen Ku, Edison, NJ (US)

(72) Inventors: Yicheng Lu, East Brunswick, NJ (US); Yang Zhang, Piscataway, NJ (US); Chieh-Jen Ku, Edison, NJ (US)

(73) Assignee: Rutgers, The State University of New Jersey, New Brunswick, NJ (US)

( * ) Notice: Subject to any disclaimer, the term of this patent is extended or adjusted under 35 U.S.C. 154(b) by 0 days.

(21) Appl. No.: 13/781,915

(22) Filed: Mar. 1, 2013

(65) Prior Publication Data
US 2014/0027702 A1     Jan. 30, 2014

Related U.S. Application Data

(66) Continuation of application No. 13/549,413, filed on Jul. 13, 2012, now abandoned, Substitute for application No. 61/644,068, filed on May 8, 2012.

(60) Provisional application No. 61/507,293, filed on Jul. 13, 2011.

(51) Int. Cl.
    *H01L 29/10*     (2006.01)
    *H01L 27/24*     (2006.01)
    *H01L 45/00*     (2006.01)

(52) U.S. Cl.
    CPC ............ *H01L 27/2481* (2013.01); *H01L 45/00* (2013.01); *H01L 27/24* (2013.01); *H01L 45/146* (2013.01); *H01L 45/1233* (2013.01)
    USPC .......... 257/43; 257/2; 257/3; 257/4; 365/148; 365/163

(58) Field of Classification Search
    USPC ...................... 257/2–5, 43; 365/148
    See application file for complete search history.

(56) References Cited

U.S. PATENT DOCUMENTS

| | | | |
|---|---|---|---|
| 2009/0289251 A1* | 11/2009 | Kiyotoshi | 257/43 |
| 2011/0128779 A1* | 6/2011 | Redaelli et al. | 365/163 |
| 2011/0140762 A1* | 6/2011 | Jiang et al. | 327/365 |
| 2011/0186799 A1* | 8/2011 | Kai et al. | 257/3 |

* cited by examiner

*Primary Examiner* — Matthew W Such
*Assistant Examiner* — Frederick B Hargrove
(74) *Attorney, Agent, or Firm* — Fox Rothschild LLP

(57) ABSTRACT

A vertically integrated reconfigurable and programmable diode/memory resistor (1D1R) and thin film transistor/memory resistor (1T1R) structures built on substrates are disclosed.

10 Claims, 18 Drawing Sheets

FIG. 17

|  | As deposited | O$_2$ annealed |
|---|---|---|
| N$_{TA}$ (cm$^{-3}$/eV) | $1.5*10^{22}$ | $8*10^{21}$ |
| W$_{TA}$ (eV) | 0.045 | 0.05 |
| N$_{GA}$ (cm$^{-3}$/eV) | $9.3*10^{18}$ | $3.8*10^{18}$ |
| W$_{GA}$ (eV) | 0.25 | 0.25 |
| On-off ratio | $10^8$ | $10^9$ |
| Mobility (cm$^{-2}$/V-s) | 35 | 38 |
| Threshold voltage (V) | 2 | 10 |
| Subthreshold Swing (V/dec) | 0.65 | 0.4 |

MULTIFUNCTIONAL ZINC OXIDE NANO-STRUCTURE-BASED CIRCUIT BUILDING BLOCKS FOR RE-CONFIGURABLE ELECTRONICS AND OPTOELECTRONICS

REFERENCE TO RELATED APPLICATIONS

This application is a Continuation of U.S. patent application Ser. No. 13/549,413, flied Jul. 13, 2012, which claims priority to U.S. Provisional Patent Application Serial Nos. 61/507,293 filed Jul. 13, 2011 and 61/644,068 filed May 8, 2012, both of which are hereby incorporated by reference as if fully disclosed herein.

STATEMENT REGARDING FEDERALLY FUNDED RESEARCH

This invention was made with government support under AFOSR Grant Contract Number: FA9550-08-01-0452.

FIELD OF THE INVENTION

The present invention relates to integration of multifunctional ZnO-based devices technologies including memory resistors, thin film transistors, and diodes into the basic circuit building blocks for use in reconfigurable electronic and optoelectronic systems.

BACKGROUND OF THE INVENTION

Information technology is experiencing increased need for reconfigurable systems-on-demand that are capable of on-the-fly task and defect adaption, in real-time, and at a lower cost. High-performance electronic systems combining state-of-the-art processing logic, memories, and sensors on a single chip is desired. The challenge in implementing an advanced reconfigurable switching matrix network that can be integrated with various functional subsystems is substantial. Furthermore, the advanced switching matrix architectures are becoming more critical in high density and high-performance systems. New embedded switching schemes should deliver high performance with large variations in device parameters when these devices approach nanometer scale. To date, even the design of such switching matrices are based on different material systems and complicated fabrication processes resulting in extremely low yield and are therefore, impossible for commercial application.

Resistive random access memory (RRAM) is emerging as a promising nonvolatile memory (NVM) device. The oxide-based resistive switching devices have inspired substantial scientific and commercial interests due to their high storage density, fast operating speed, and low power operation. Among them, ZnO-based resistive switching devices possess promising features and low cost due to its abundant material source and relatively simple processing. Furthermore, the multifunctional properties such as semiconducting and resistive switching of ZnO can be achieved through various doping processes, facilitating the device integration.

The Thin film transistor (TFTs) is a class of field effect transistors (FETs), in which the current through the channel is modulated on the same basic principle as in the Metal Oxide Semiconductor Field Effect Transistor (MOSFET). Unlike the MOSFET where the substrate material is the bulk semiconductor, such as the single crystalline silicon, in the TFT, the thin film of semiconductor materials is deposited on substrates such as glasses or polymers to form the channel layers of TFTs.

SUMMARY OF THE INVENTION

An integrated 1D1R structure is disclosed that includes a substrate, a bottom electrode, a metal oxide thin film comprising a plurality of nanostructures, a top electrode, a second metal oxide thin film comprising a plurality of nanostructures, and a Schottky contact. In embodiments, the Schottky contact is formed between the top electrode and the metal oxide layer. In embodiments, a very thin conductive layer of doped metal oxide is included reduce the contact resistance between metal oxide thin film and the bottom electrode.

In another aspect an integrated 1T1R structure is disclosed. A thin film transistor is deposited on the substrate and includes a gate electrode, a dielectric layer, a source and drain, and a metal oxide channel layer. The gate electrode of the TFT can be used as a word line (WL). A resistor structure includes a bottom electrode, a top electrode, and a metal oxide thin film disposed between the bottom electrode and top electrode. Also included in the structure are insulator layers, bit line (BL), plate line (PL), via contacts, and metal contacts.

In another aspect the integrated 1T1R can be vertically integrated "R-first" 1T1R structure wherein the memristor is deposited directly on the substrate. In another aspect the integrated 1T1R can be vertically integrated "T-first" 1T1R structure wherein the TFT is deposited directly on the substrate.

BRIEF DESCRIPTION OF THE DRAWINGS

FIG. 17 shows the summary of extracted DOS from fitting results and device performance of as-deposited ZnO TFT and $O_2$ annealed TFT FIG. 18. shows the typical inverted-staggered (bottom gate) $Mg_xZn_{1-x}O$ thin film transistor (0≤x≤6%) built on glass substrate.

DETAILED DESCRIPTION

Figure 1:
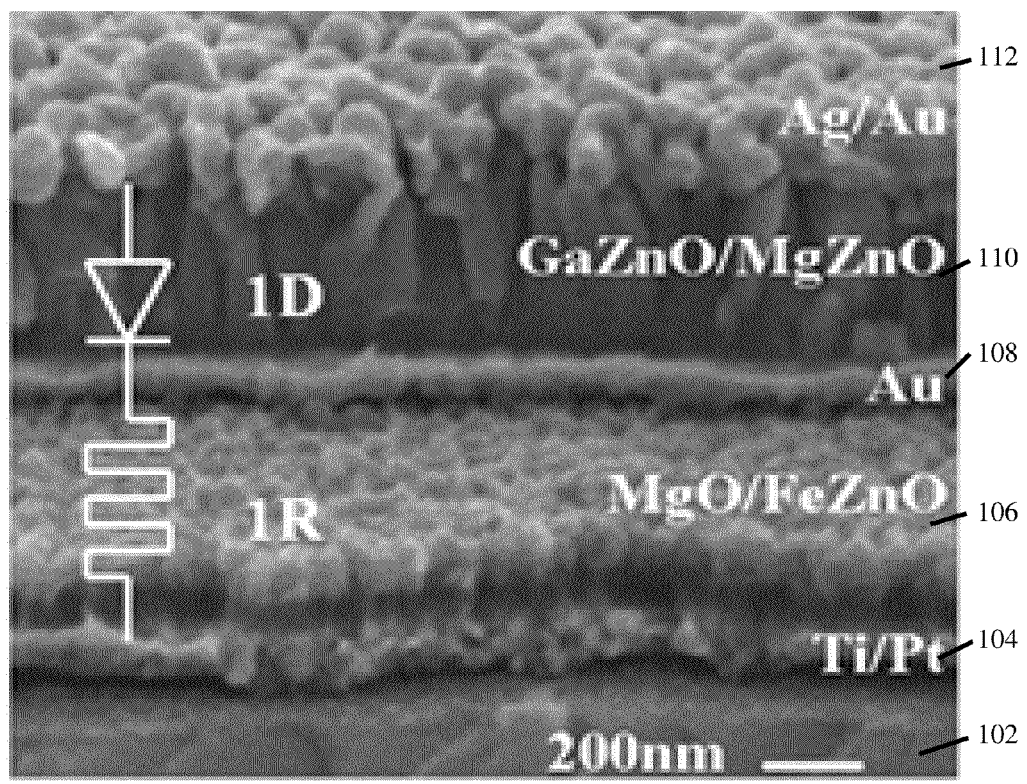
FIG. 1 shows an SEM image of the MgxZn1-xO Schottky diode integrated with a FeZnO—MgO bi-layer memristor.

ZnO films and nanostructures have been grown on various substrates by using a vertical high-speed-rotation-disk metalorganic chemical vapour deposition (MOCVD) reactor. Metalorganic, DiethylZinc (DEZn), is used as Zn precursor source. $O_2$ and Ar are used as the oxidizer and carrier gas, respectively.

Through systematic optimization, growth of the ZnO nanotips can be controlled on Si or $SiO_2$ substrates at 400-500° C. with a large adjustable processing window and good crystal quality and optical properties of the nanotip arrays are obtained. The thickness of nanotips can be controlled by adjusting the growth rate and time. The growth rate is mainly determined by the $DEZn/O_2$ flow rate ratio. The size and density of nanotips can be controlled as well, through tuning the $DEZn/O_2$ flow rate ratio in conjunction with the growth temperature.

Growth temperature plays a role in determining the final morphology of MOCVD grown ZnO. The growth temperatures of the ZnO films and ZnO nanotips were varied from 350° C. to 500° C. Under these conditions, the Zn and oxygen flow rate can be optimized to obtain the proper carrier concentration and electron mobility or optical characteristics. The adjustment of growth modes from nanotips to films or vice versa benefits the integration of ZnO with Si-based devices.

Resistive random access memory (RRAM) is emerging as a promising nonvolatile memory device. There are two types of resistive switching devices: the unipolar one in which the resistive switching between low (LRS) and high resistance state (HRS) is only dependent on the magnitude of applied voltage, but independent on the polarity, and the bipolar one in which the SET (switching from HRS to LRS) and RESET (switching from LRS to HRS) processes occur in the different polarities of the applied voltages. Various materials are used to achieve the resistive switching, including transition metal oxides, molecular materials, perovskite oxides, etc. Among them, the oxide-based resistive switching devices have generated interest due to its high storage density, fast writing/reading speed, and low power operation. ZnO-based resistive switching devices possess promising features, such as the well-controlled switching properties through in-situ doping and alloying, simple and cost effective fabrication process, and radiation hardness.

A crossbar array can offer many advantages including high density and easy multi-bit operation. However, the crossbar array which only consists of a resistive switching device (R) between the top and bottom electrodes has an inevitable crosstalk issue when a reverse voltage is applied to the array, leading to reading disturbance among the neighboring cells. To avoid such malfunctions in the crossbar configuration, the 1D1R cell consisting of a diode (1D) and a resistor (1R) is needed.

There are unique advantages of using unipolar switching over the bipolar counterpart in the crossbar system. First, the unipolar resistance switching only depends on the magnitude and is independent on the polarity of the applied voltage. These characteristics facilitate faster writing speed in memory. Second, the different absolute values of the SET and RESET voltages which are used in unipolar switching can prevent read/write confusion under circumstances when multiple-control signals may be present. Schottky diode-based 1D1R structures in the crossbar system are supposed to offer the advantages of a single polarity of SET and RESET voltages, and much larger HRS/LRS ratio in low forward voltages, leading to convenient and faster operation. However, conventional oxide-based 1D1R structures using Schottky diodes have been composed with the dissimilar oxide materials. These conventional devices show relatively low $R_{HRS}/R_{LRS}$ ratios and short retention time, presumably due to complex material interfaces and difficult integration process. These deficiencies of the prior art are overcome in a fully ZnO-based 1DIR device disclosed herein, which includes integration of a MgZnO Schottky diode and a FeZnO unipolar switching resistor.

More specifically, an embodiment of a ZnO-based vertical 1D1R structure includes an integrated Ag/MgZnO Schottky diode and FeZnO/MgO unipolar switching resistor. The vertical 1D1R structure is ideal for the crossbar configuration as it can increase the memory density. Furthermore, the vertically integrated 1D1R is preferred for 3-dimensional (3-D) integration. A scanning electron microscopy (SEM) image of a 1D1R structure is shown in FIG. 1. In the example embodiment of FIG. 1, the 1D1R structure includes a substrate 102; metal layers 104, 108, 112, and metal oxide layers 106, 110. The 1D1R structure is described in greater detail below.

FeZnO is selected as a switching layer for memristors. As a deep level donor in ZnO, Fe doping can increase the resistivity of the high resistance state (HRS) for resistive switching. The Fe-doped ZnO nanostructures are deposited on Pt-coated $SiO_2/Si$ substrates using MOCVD. The growth is optimized by adjusting growth parameters such as substrate temperature, chamber pressure, and gas flow rates. In order to maintain the wurtzite structure and c-axis preferred growth for ZnO nanostructures, Fe composition was kept below 10%. The solid solubility of Fe ions in the ZnO system is high (over 90%). However, the diffusion coefficients and the decomposition rates of two metalorganic (MO) reactive species for Zn and Fe are different, consequently, so are the reaction rates with $O_2$. Therefore, $Fe_xZn_{1-x}O$ nanotips growth is more complicated than that of pure ZnO nanotips. A higher temperature (500° C.-520° C.) and a low growth rate for $Fe_xZn_{1-x}O$ nanotips is used compared to that of ZnO nanotips. The lower temperature and growth rate allows for larger diffusion energies of Fe adatoms and more sufficient diffusion time to incorporate into appropriate positions in the ZnO lattice. The Fe composition can be finely tuned by adjusting the flow rate ratio of Fe and Zn precursors.

Figures 2A, 2B, 2C:
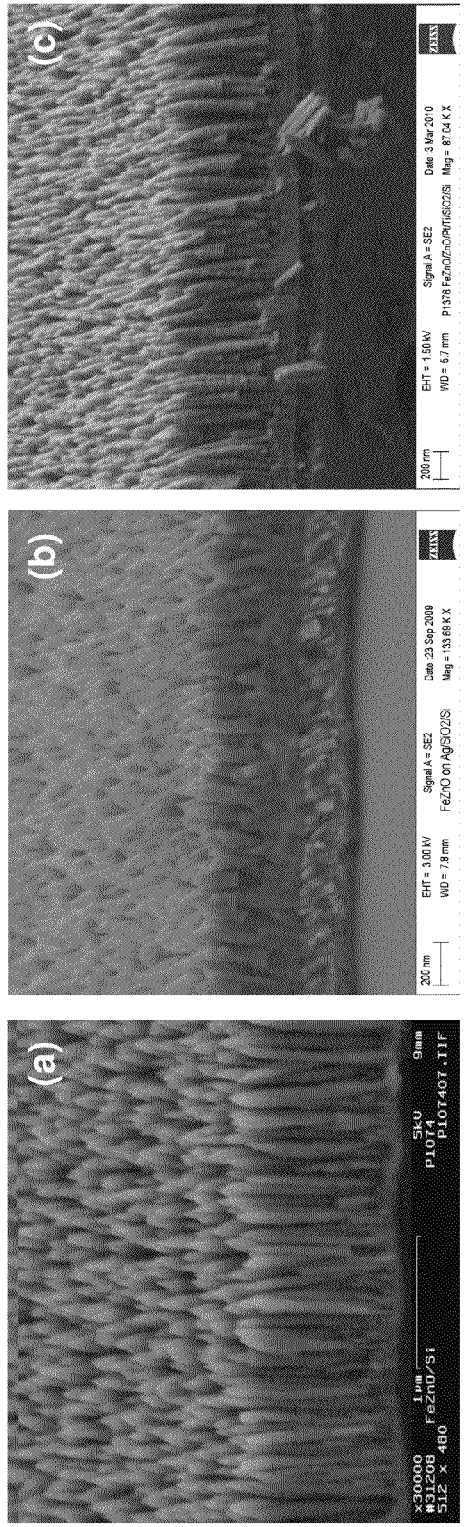
FIG. 2A shows FeZnO nanotips grown on an Si substrate.
FIG. 2B shows FeZnO nanotips grown on an Ag/SiO2/Si substrate.
FIG. 2C shows FeZnO nanotips grown on a Pt/SiO2/Si substrate.
Figure 3:
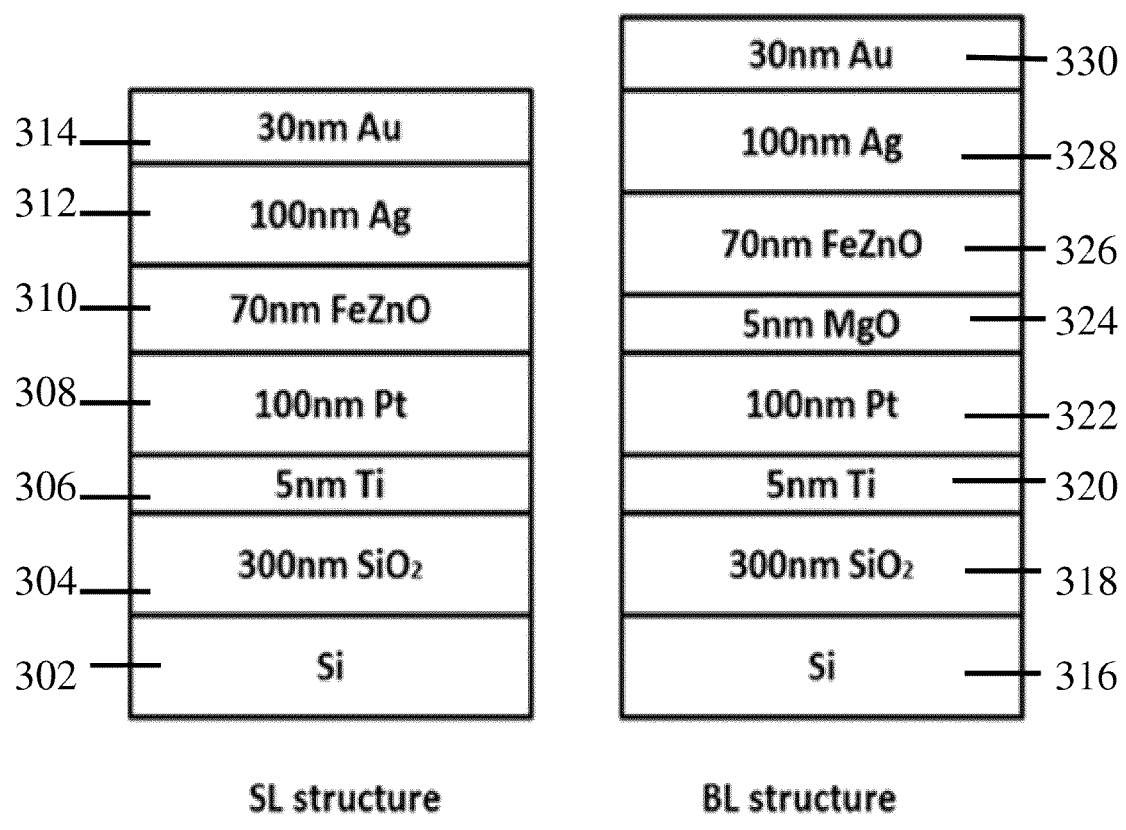
FIG. 3 shows exemplary schematic diagrams of the resistive switching structures including an Ag/FeZnO/Pt (SL) structure and an Ag/FeZnO/MgO/Pt (BL) structure.

FIGS. 2A-2C show the optimized $Fe_xZn_{1-x}O$ (x~4%) nanotips grown on Si (FIG. 2A), Ag/SiO2/Si (FIG. 2B) and Pt/SiO2/Si (FIG. 2C) substrates, where FIG. 2B and FIG. 2C only show the memristor structures without the top electrodes. These nanotips shown in FIGS. 2A-2C are well aligned along the axis normal to the substrate (c-axis) and exhibit a large aspect ratio about 10 (ratio of length to width) that is comparable to that of ZnO nanotips. The x-ray diffraction (XRD) result, shown in FIG. 5 described below, also confirms that these nanotips have the c-axis preferred orientation and good crystal quality comparable to the ZnO nanotips.

An embodiment of a bi-layer (BL) structure of $Fe_xZn_{1-x}O$—MgO can improve the switching performance of memristors. In a BL structure, a thin MgO layer (~5 nm) is grown on Pt surface, then a $Fe_xZn_{1-x}O$ (x~4%) layer is subsequently grown on top of the MgO layer, both by MOCVD. For the MgO growth, bis(methylcyclopentadienyl)magnesium (MCp2Mg) and UHP $O_2$ can be used as the Mg precursor and oxidizer, respectively. The MgO can be grown at a substrate temperature of 300~350° C. and the as-grown MgO layer will appear to be amorphous. The $Fe_{0.04}Zn_{0.96}O$ layer in BL structure can be grown under the same growth conditions as that in the SL structure. Referring to FIG. 2, an embodiment of a SL oxide structure includes a substrate comprising a layer of silicon 302 and $SiO_2$ 304, a thin layer of Ti 306 and a layer of Pt 308 that form the bottom electrode, a single metal oxide layer 310 (i.e. FeZnO), and a layer of Ag 312 and a layer of Au 314 that form the top electrode. Referring to FIG. 2, an embodiment of a BL oxide structure includes a layer of silicon 318 and $SiO_2$ 318, a thin layer of Ti 320 and a layer of Pt 322 that form the bottom electrode, a first (324) and second (326) metal oxide layer (i.e. MnO & FeZnO), and a layer of Ag 328 and a layer of Au 330 that form the top electrode. In addition to MgO other oxides that can be used include $Al_2O_3$, $HfO_2$, $Ta_2O_5$, NiO, $TiO_2$, $SiO_2$, $Nb_2O_5$, $ZrO_2$, CoO, $SnO_2$, $Ga_2O_3$, and/or $SrTiO_3$.

Figure 4:
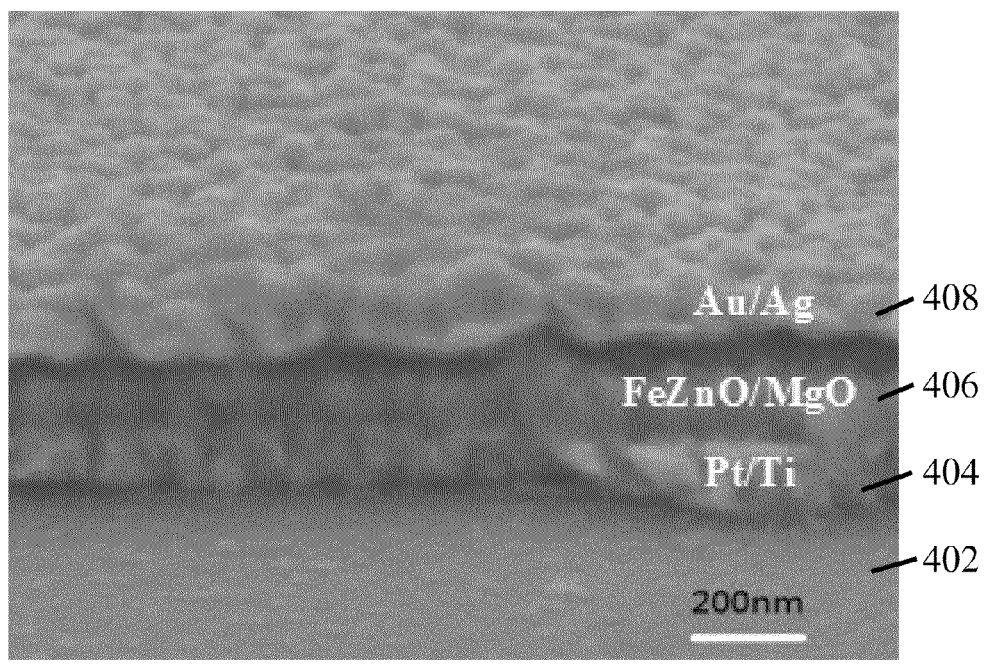
FIG. 4 shows a scanning electron microscopy (SEM) image of the FeZnO—MgO BL structure.

FIG. 4 shows a SEM image of an embodiment of a Ag/FeZnO—MgO/Pt (BL) structure. The structure includes a substrate 402, a bottom electrode 404, a metal oxide layer 406, and top electrode 408. In embodiments, the bottom electrode 404 and top electrode 408 may include multiple metal layers. For example, FIG. 2 shows a Pt/Ti bottom electrode 404 and a Au/Ag top electrode 408. Due to the small thickness (~5 nm) of the MgO layer, it is not separately shown in FIG. 4.

Figure 5:
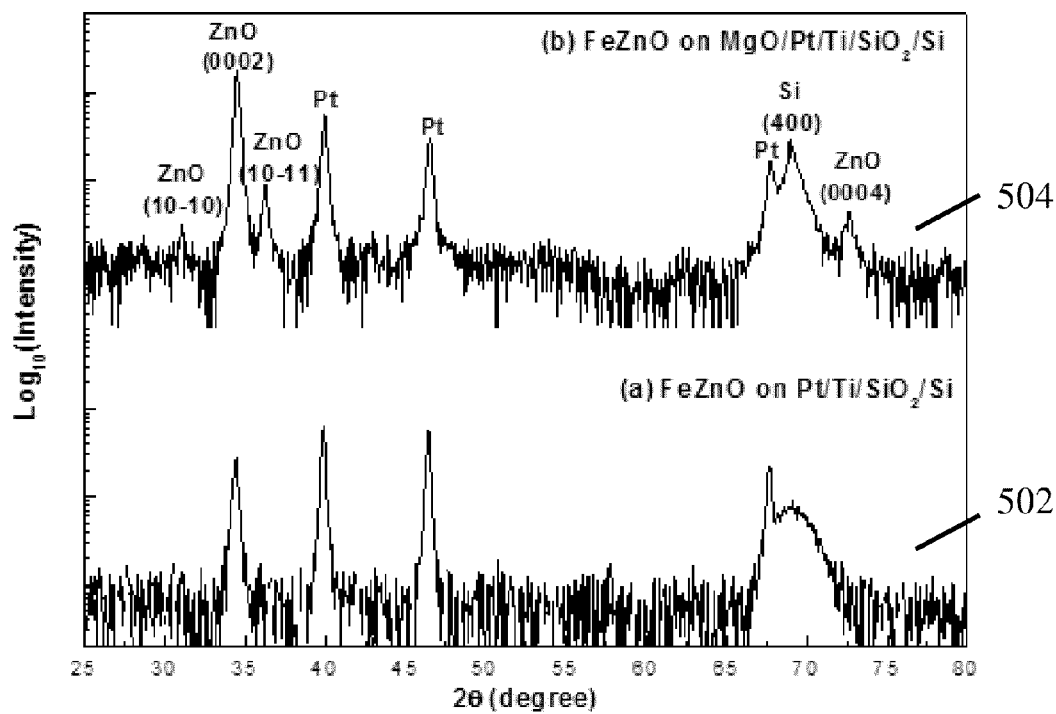
FIG. 5 shows an x-ray diffraction (XRD) spectra of the FeZnO deposited (a) on the Pt/Ti/SiO2/Si, and (b) on the MgO/Pt/Ti/SiO2/Si.

FIG. 5 shows example x-ray diffraction (XRD) results of FeZnO single layer (SL) 502 and FeZnO—MgO BL 504 structures grown on Pt/Ti/$SiO_2$/Si substrates. The as-grown MgO layer is amorphous, however, it could be re-crystallized during the subsequent $Fe_xZn_{1-x}O$ growth at high temperature (~500° C.). The small thickness (~5 nm) of the MgO layer renders it undetectable in XRD. The XRD patterns of $Fe_xZn_{1-x}O$ (x~4%) are indexed by using diffraction data of ZnO (JCPDS ICDD PDF No. 89-0510). The FeZnO layers in both SL and BL structures show the wurtzite structure without a phase separation and they are highly textured along c-axis. However the additional peaks of (10-10) and (10-11) appear in the FeZnO layer of the BL structure 504 but not from the SL structure 502. This implies that the texturing of FeZnO layer grown on Pt is different from that grown on MgO surface. When a FexZn1-xO (x~4%) layer is directly deposited on the Pt surface, due to a lack of epitaxial relationship, the adatoms (having high surface diffusion rate at substrate temperature) tend to arrange themselves toward the direction with the lowest surface energy so that the FeZnO layer would grow predominantly along the c-axis direction, while growth of crystallites with other orientations is inhibited (FIG. 5(a)). However, when the FeZnO is grown on the MgO layer, MgO can be re-crystallized and its crystalline grains provide crystallographic alignment to the FeZnO film. This induces growth along the other orientations besides c-axis. However, the growth mode will finally switch to the c-axis direction due to large surface energy anisotropy of ZnO.

A ZnO Schottky diode (D) may be integrated with a FeZnO unipolar memristor (R) as described above to form a 1D1R structure. This arrangement advantageously avoids the reading/writing malfunctions when memristor (R) devices are put in the crossbar configuration. In a 1D1R structure, a ZnO Schottky diode is fabricated on the top of the memristor, and includes a high temperature grown ZnO layer and two electrodes. Au layer may be used to form a Schottky contact to ZnO and Al may be deposited as an Ohmic contact layer. The ratio of the forward (on) over the reverse (off) current of single diode is $9.8 \times 10^2$ at 2 V, which is not good for the integration since it limits the performance of the 1D1R structure. The low ratio of $I_{forward}/I_{reverse}$ (or $I_{on}/I_{off}$) is mainly caused by the relatively large reverse current ($I_{reverse}$) or off current ($I_{off}$), which is attributed to the high intrinsic doping level of as-grown ZnO layer. In order to improve the diode performance, $Mg_xZn_{1-x}O$, formed by alloying ZnO with MgO, may be used in the diode structure. The Mg substitution into ZnO increases the activation energy for defect-related donor states by increasing the band gap and thus reduces the carrier density in the ZnO layer. Therefore, $Mg_xZn_{1-x}O$ is expected to reduce the reverse current of the diode compared to ZnO.

$Mg_xZn_{1-x}O$ films were grown by MOCVD at a substrate temperature of 500-520° C. The Diethylzinc (DEZn) and Bis(methylcyclopentadienyl)magnesium (MCp2Mg) may be used as the Zn and Mg precursors, respectively, both of which can be carried to the reactor by ultra-high purity (UHP), i.e. >99.999%, Ar gas. UHP oxygen gas may be used as the oxidizer and injected into the chamber with a separate line for avoiding the phase reaction. The Mg composition was tuned by simply changing the precursors flow rate ratio ($MCp_2Mg$/DEZn).

FIG. 4 shows transmission spectra of as-grown $Mg_xZn_{1-x}O$ films with different Mg contents (x), measured at room temperature with a UV-visible spectrophotometer. It is seen that there is a continuous blue shift of absorption edges with the increase of x, indicating an increase of bandgap with x. The resistivity and carrier concentration of $Mg_xZn_{1-x}O$ films were measured by a Van der Pauw/Hall effect measurement, as shown in FIG. 5. From that, the increased resistivity and reduced carrier concentration with x are observed. In contrast to ZnO, $Mg_xZn_{1-x}O$ film with wider bandgap and lower carrier concentration will modify the Schottky barrier and reduce the reverse current of the diode.

The reverse current ($I_{reverse}$ or $I_{off}$) of the diode reduces with increasing Mg content. But the forward current ($I_{forward}$ or $I_{on}$) starts to decrease as x is up to 5%. In an embodiment, good diode performance may be obtained on a $Mg_{0.06}Zn_{0.94}O$ film with a $I_{on}/I_{off}$ ratio of up to $2.4 \times 10^7$ at 1V. Additionally, both forward current ($I_{forward}$ or $I_{on}$) and reverse current ($I_{reverse}$ or $I_{off}$) decrease with the increase of the film thickness. But the decrease of $I_{on}$ is much smaller compared to that of $I_{off}$ when the film thickness is not too high. In an embodiment, the thickness of the film is ~350 nm.

Referring again to FIG. 1, an SEM image of an embodiment of a $Mg_xZn_{1-x}O$ Schottky diode vertically integrated with a $Fe_xZn_{1-x}O$ memristor is shown. The integrated 1D1R structure includes a substrate 102, a first metal layer 104, a first metal oxide layer 106, a second metal layer 108, a second metal oxide layer 110, and a third metal layer 112. In an embodiment, the Schottky contact is formed between an Ag and/or Au top electrode 112 and $Mg_xZn_{1-x}O$ oxide layer 110. In embodiments, a very thin (~10 nm) conductive layer of Ga-doped ZnO (GZO) may be grown before starting the $Mg_xZn_{1-x}O$ film growth to reduce the contact resistance between $Mg_xZn_{1-x}O$ oxide layer 110 and the Au bottom electrode 118. In an embodiment, the GZO film is heavily doped with a carrier concentration of $~10^{20}$ cm$^{-3}$, and is very conductive with a resistivity of $~10^{-4}$ Ωcm. It provides good Ohmic contact to Au and thus improves the $I_{on}$ of the diode. In addition to GZO, other compounds can be used including Al-doped ZnO (AZO) and In-doped ZnO (IZO).

Memristor ("memory-resistor") is a new fundamental circuit element, whose resistance depends on the history of applied voltage (magnitude, polarity, and duration). Compared with other charge-storage memory, the oxide resistive switching memories ($O_xRRAM$) are emerging as nonvolatile memory technology due to their ability of scaling, high storage density, fast write time, and low power operation. ZnO RRAM devices can be built on glass and $SiO_2$/Si substrates, offering full optical transparency, large $R_{HRS}/R_{LRS}$ ratio, fast programming speed, and long retention time.

Figure 7:
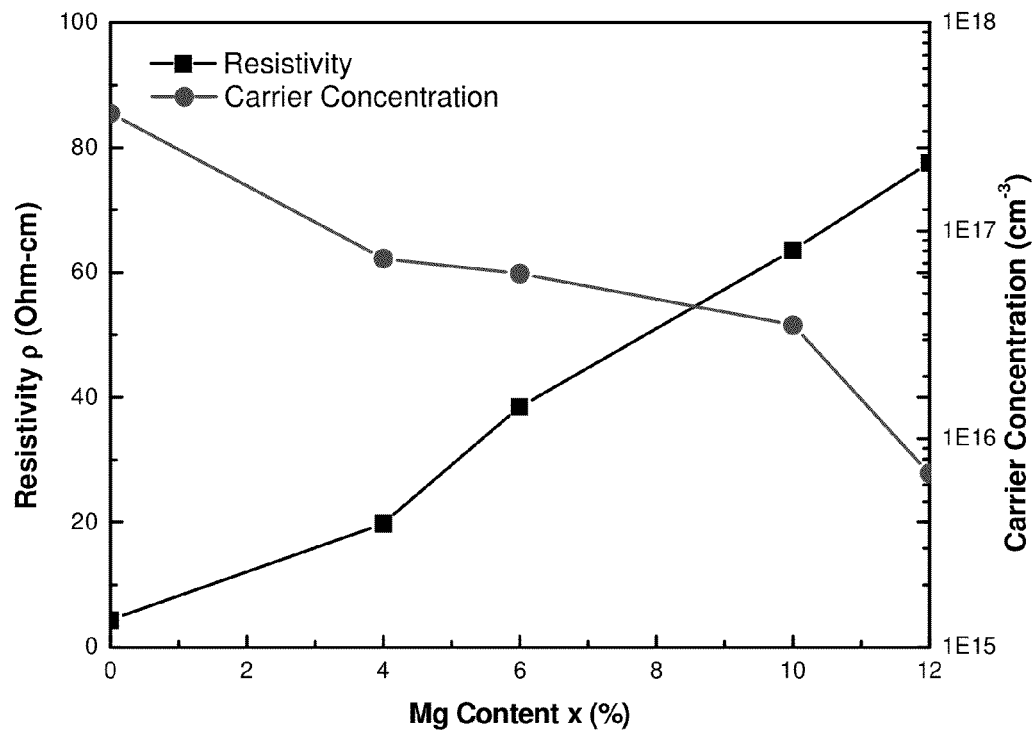
FIG. 7 shows resistivity and carrier concentration of $Mg_xZn_{1-x}O$ films as a function of Mg content (x).

Resistive switching can be attributed to formation and rupture of conductive filaments in the oxides, which are closely related to oxygen vacancies and oxygen ions, or metal ions. However, the difficulty in control of the length and amount of conductive filaments in resistive memory fabricated in a single-layer (SL) oxide structure prevents the device from achieving a high and stable $R_{HRS}/R_{LRS}$ ratio, which could cause possible false programming and readout hazards. To overcome these problems, a high performance bipolar resistive switch device is described. In embodiments, this device has an Ag/FeZnO/MgO/Pt (BL) structure. The I-V characteristics of SL and BL structure are shown in FIG. 7A. A SEM image of an embodiment of a Ag/FeZnO/MgO/Pt (BL) structure is shown and described with reference to FIG. 2 above.

Figure 8:
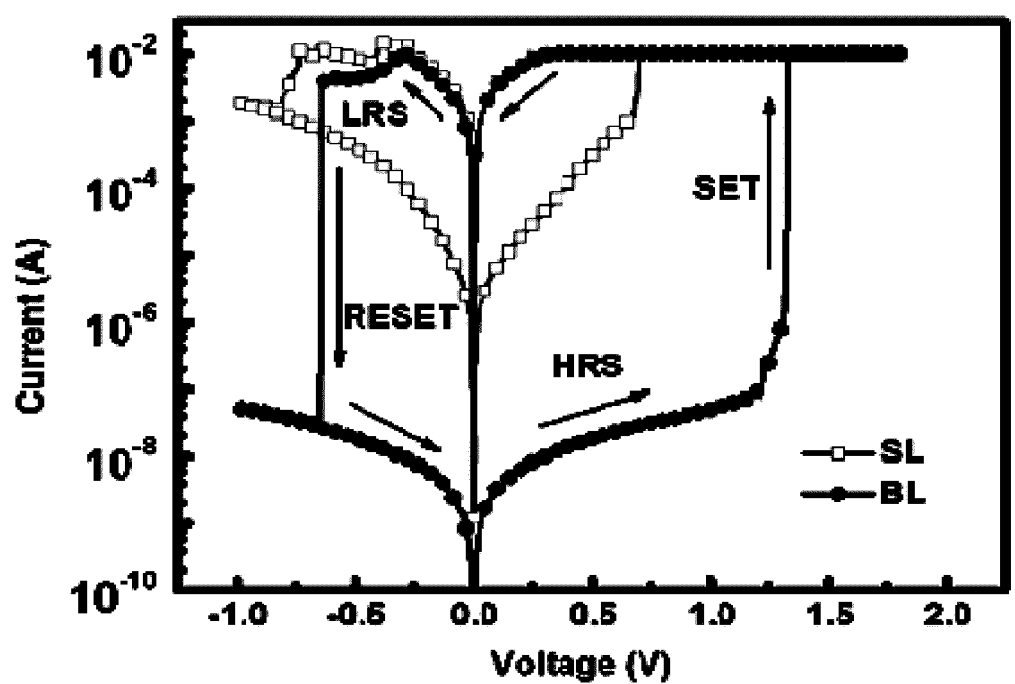
FIG. 8 shows the I-V characteristics of the Ag/FeZnO/Pt (SL) structure and the Ag/FeZnO/MgO/Pt (BL) structure.

FIG. 8 exhibits the resistive switching characteristics of the Ag/FeZnO/Pt (SL) structure and the Ag/FeZnO/MgO/Pt (BL) structure. During the measurements, the bottom electrode is grounded and the varied voltage is applied on the top electrode. When voltage is less than the threshold switching voltage, the current is relatively small and the device is in the HRS 802. When the voltage reaches $V_{SET}$ 804, the current increases dramatically and the device switches to LRS 806. The switching device remains in LRS, until the voltage reduces to $V_{RESET}$ 808, then the current decreases sharply and the device switches from LRS back to HRS 802. The reversible I-V curve loop indicates the memory behavior. Under the reading voltage that is usually chosen between $V_{SET}$ and $V_{RESET}$, HRS and corresponding small current could be recognized as the logic "0" (OFF) while the large current in LRS represents the logic "1" (ON) in the memory circuit. Under a reading voltage of 0.2 V, the currents flow through the HRS and LRS of the SL structure are $1.8\times10^{-5}$ A and $6.8\times10^{-3}$ A, corresponding to the $R_{HRS}$ and $R_{LRS}$ of $1.1\times10^4$Ω and 29Ω, respectively. The ratio of $R_{HRS}/R_{LRS}$ is $3.8\times10^2$. The $V_{SET}$ is 0.70 V and the $V_{RESET}$ is -0.77 V, which corresponds to an electrical field of around 10 kV/cm. The electrical field may be smaller than other ZnO resistive switching devices, which can benefit the retention performance. Both threshold voltages are far away from the reading voltage, which can prevent the reading voltage from triggering the switching process and leading to severe problems in controlling and reading the memory switching states.

Figure 9A:
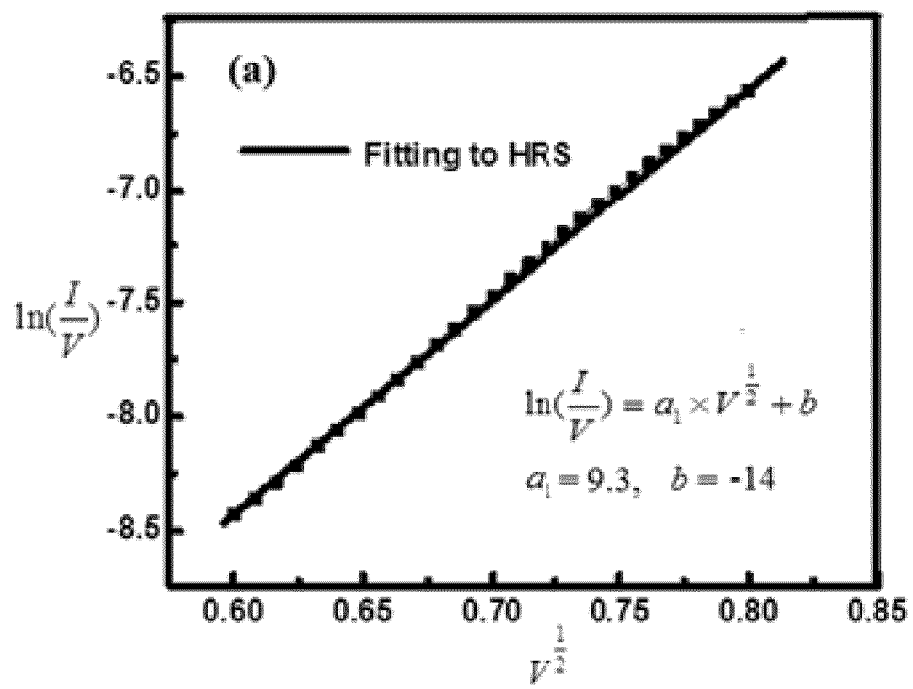
FIG. 9A shows curve fitting for measured I-V characteristics of the SL structure at (a) HRS.
Figure 9B:
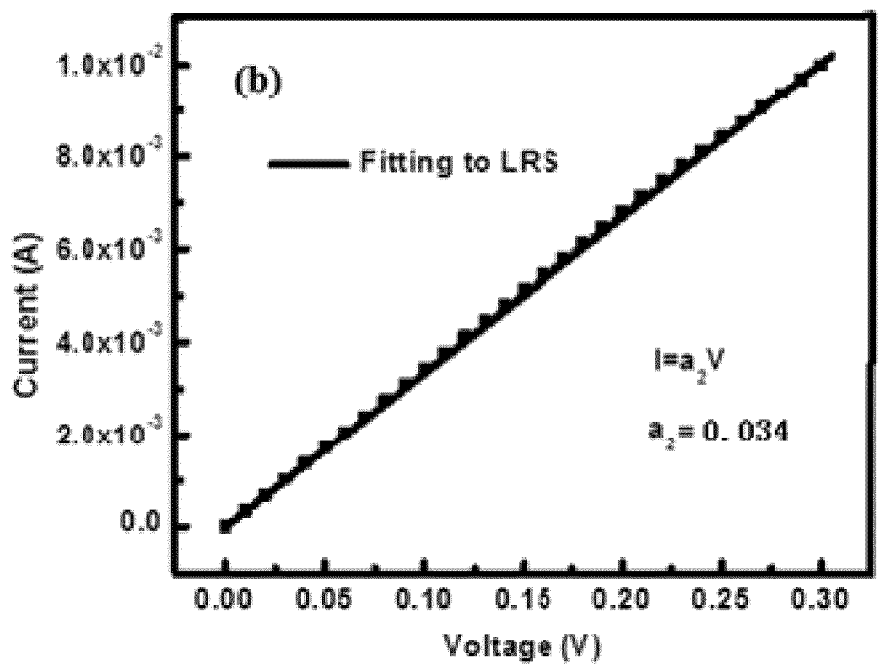
FIG. 9B shows curve fitting for measured I-V characteristics of the SL structure at LRS.

FIGS. 9A and 9B show the curve fitting for the I-V characteristics of the SL structure at HRS and LRS, respectively. The HRS curve from FIG. 9A is fitted well to the following equation:

$$\ln\left(\frac{I}{V}\right) = a_1 \times V^{\frac{1}{2}} + b \quad \text{(Equation 1)}$$

It accounts for the Poole-Frenkel emission (PFE) model, which is $$\ln\left(\frac{J}{E}\right) \propto q^{\frac{3}{2}} (\pi\varepsilon_r\varepsilon_0)^{-\frac{1}{2}} (rkT)^{-1} E^{\frac{1}{2}} \quad \text{(Equation 2)}$$

where J is the current density, E is the electric field, q is the electric charge, $\in_r$ is the relative permittivity of the material, $\in_0$ is the permittivity of free space, k is the boltzmann's constant, and T is the temperature. In the fitting of the equation (1) the value of a1 and b are found to be 9.3 and -14, respectively. The well-fitted result implies that the dominant conduction mechanism in HRS is the emission of trapped electrons in the FeZnO layer. It is speculated that the resistive switching is attributed to the formation and rupture of conductive filaments that are related to the oxygen vacancies and oxygen ions. At the LRS of FIG. 11(b), the IV curve is fitted well to the linear straight line $I=a_2 V$, where the fitting parameter value of $a_2$ is $3.4\times10^{-2}$. Thus, the conduction mechanism in LRS follows the Ohmic behavior.

Referring again to FIG. 8, the I-V characteristics of BL structure are shown. The currents in HRS and LRS are $6.5\times10^{-9}$ A and $6.4\times10^{-3}$ A at 0.2 V, corresponding to the resistance values of $3.1\times10^7$Ω and 31Ω, in HRS and LRS, respectively. The I-V characteristics of both structures have the similar $R_{LRS}$; however, the $R_{HRS}$ of the BL increases by $10^3$ over that of the SL structure. The ratio of $R_{HRS}/R_{LRS}$ for BL structure is $9.9\times10^5$, which is also more than three orders larger than that of the SL structure ($3.8\times10^2$). The significantly enhanced $R_{HRS}/R_{LRS}$ of BL structure leads to large difference in reading ON/OFF signal, which can minimize the confusion in reading signal of "0" and "1" when it is used for the nonvolatile memory applications.

Figure 10:
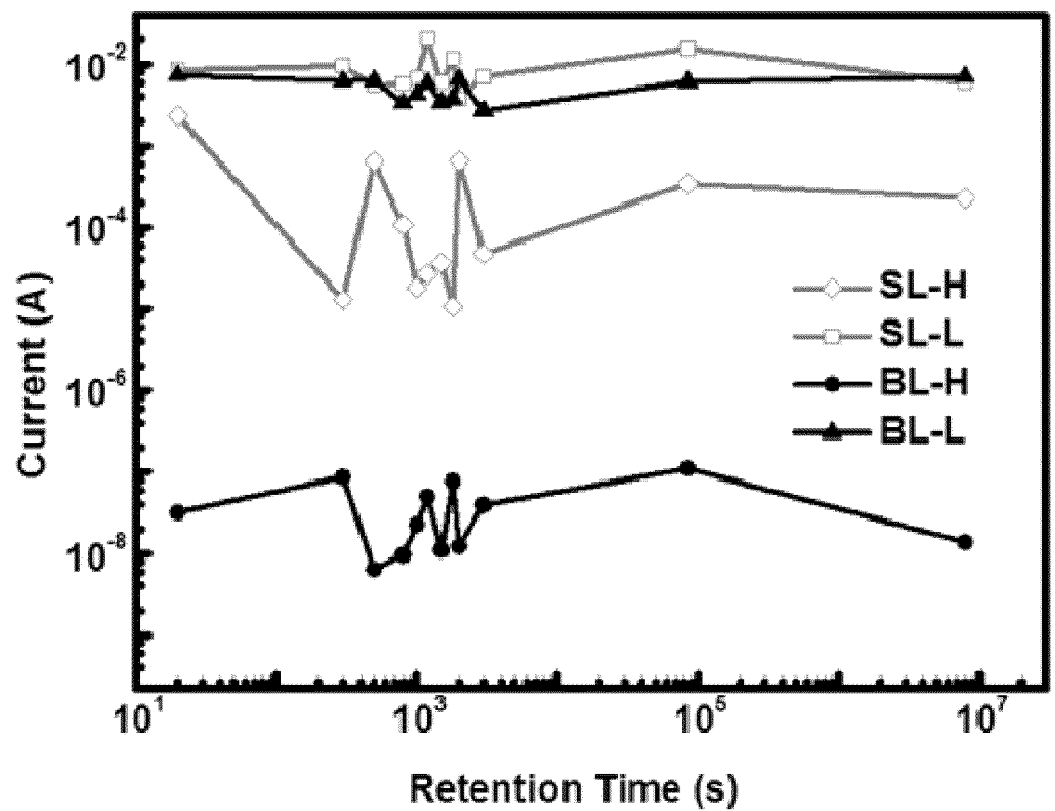
FIG. 10 shows retention time of the SL and BL structures.

The measured retention times of both structures are over $10^7$ s as illustrated in FIG. 10, indicating the robust performance of the resistive switching devices. The high thermal stability from Fe doping in ZnO may result in better endurance performance. In comparison of the currents in the HRS of the SL and BL structures, the peak-to-valley ratios for the SL and BL curves are $2.1\times10^2$ and 17, respectively. A narrow switching current distribution and high $R_{HRS}/R_{LRS}$ ratio ($>10^5$) are obtained in the BL structure, which may lead to the better and repeatable device performances. Since currents in the HRS and LRS are recognized as the OFF and ON signal in the reading step, minimized dispersion of the currents is desired for the reading process of the memory devices.

Figure 11A:
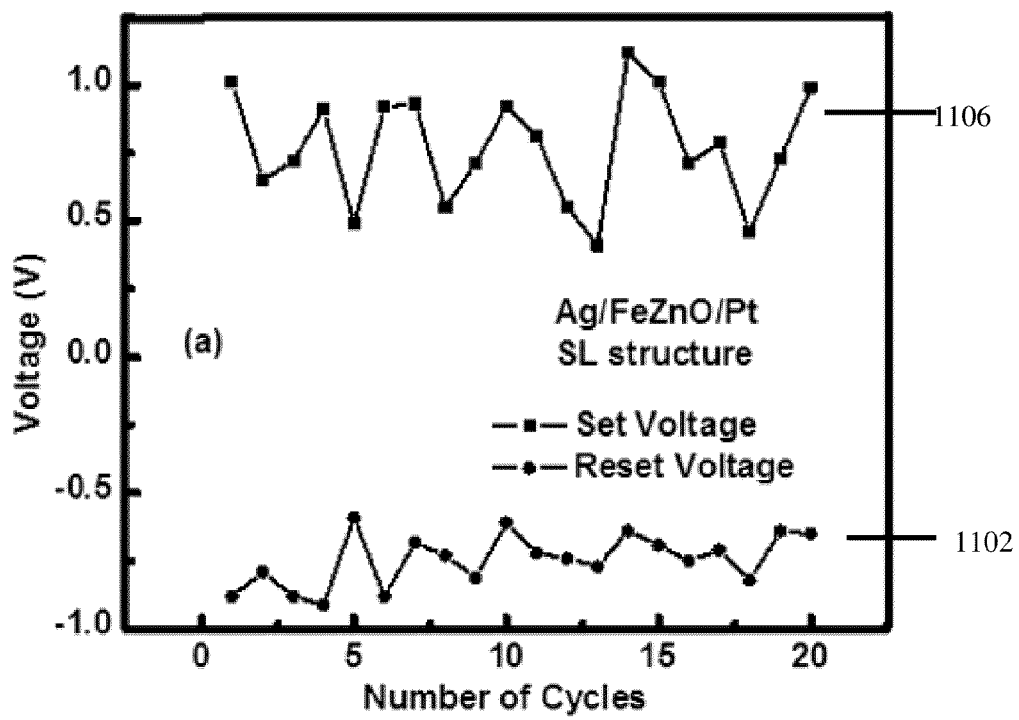
FIG. 11A shows the distribution of the operation voltages of the SL structures.
Figure 11B:
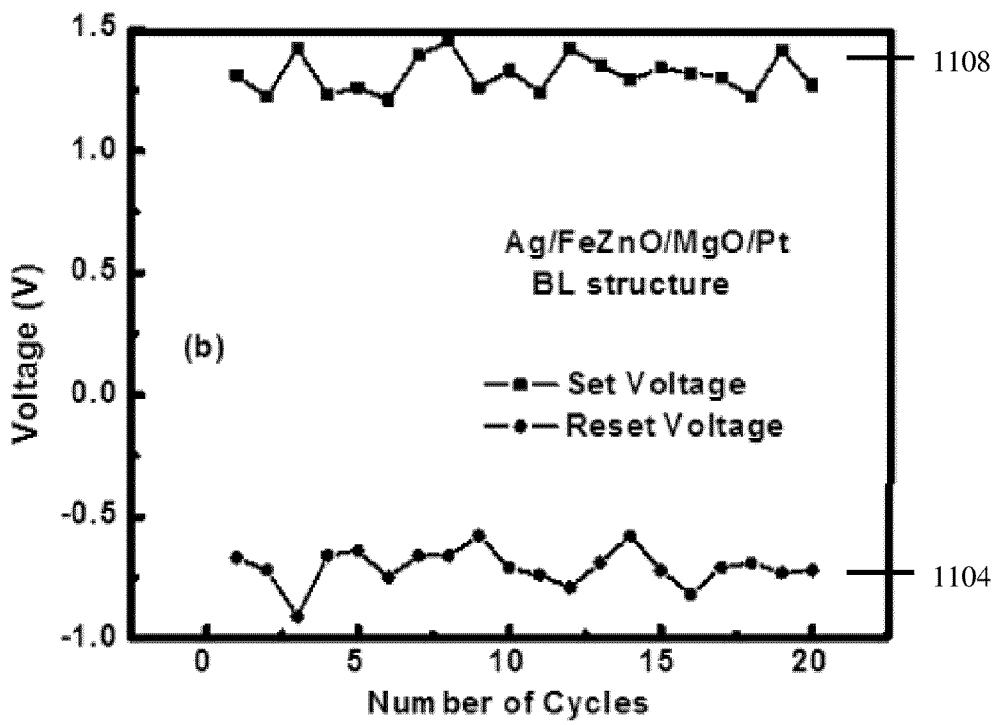
FIG. 11B shows the distribution of the operation voltages of the BL structures.

The switching voltage distributions of 20 cycles for the device with the SL and BL structure are shown in FIGS. 11A and 11B, respectively. In FIG. 11A, the reset voltages $V_{RESET}$ 1102 are in the range of -0.91 V to -0.59 V, with the average voltage of -0.75 V, and a standard deviation of 0.097 V. In FIG. 11B, the $V_{RESET}$ values 1104 are in the range of −0.97 V to −0.58 V, with the average voltage of −0.71 V and a standard deviation of 0.085 V. Referring again to FIG. 11A, the set voltages $V_{SET}$ 1106 are in the range of 0.46 V to 1.12 V, with the average voltage of 0.77 V, and a standard deviation of 0.21 V. Referring again to FIG. 11B, the set voltages 1108 are in the range of 1.21 V to 1.45 V, with the average voltage of 1.31 V and a standard deviation of 0.075 V. Both SL and BL structures have similar value range and distribution of $V_{RESET}$. But the $V_{SET}$ of the BL is larger than that of the SL structure. By comparing the standard deviation values, it is shown that the $V_{SET}$ dispersion of the BL structure is significantly reduced in comparison with that of the SL structure. Since the $V_{SET}$ value is directly related to the writing process of the memory, thus the narrow distribution of the $V_{SET}$ would improve the stability of the memory devices.

The formation of oxygen vacancies and oxygen ions is closely related to the bonding energy of metal and oxygen (M-O) in the oxide layer. It is more difficult to form the oxygen vacancies and oxygen ions in the oxide layer with a higher (M-O) bonding energy than in the oxide layer with a lower (M-O) bonding energy. In the BL structure, the bonding energy of Mg—O (393.7 kJ/mol) is higher than that of Zn—O (284.1 kJ/mol), leading to more difficulties in forming the oxygen vacancies and oxygen ions in the MgO layer; therefore the corresponding conductive filaments in the BL structure are less than that in the SL structure, resulting in higher $R_{HRS}$ and reduced dispersion of the resistive switching parameters. The similar improvement of switching characteristics has been also observed in other BL structures.

Figures 12A, 12B:
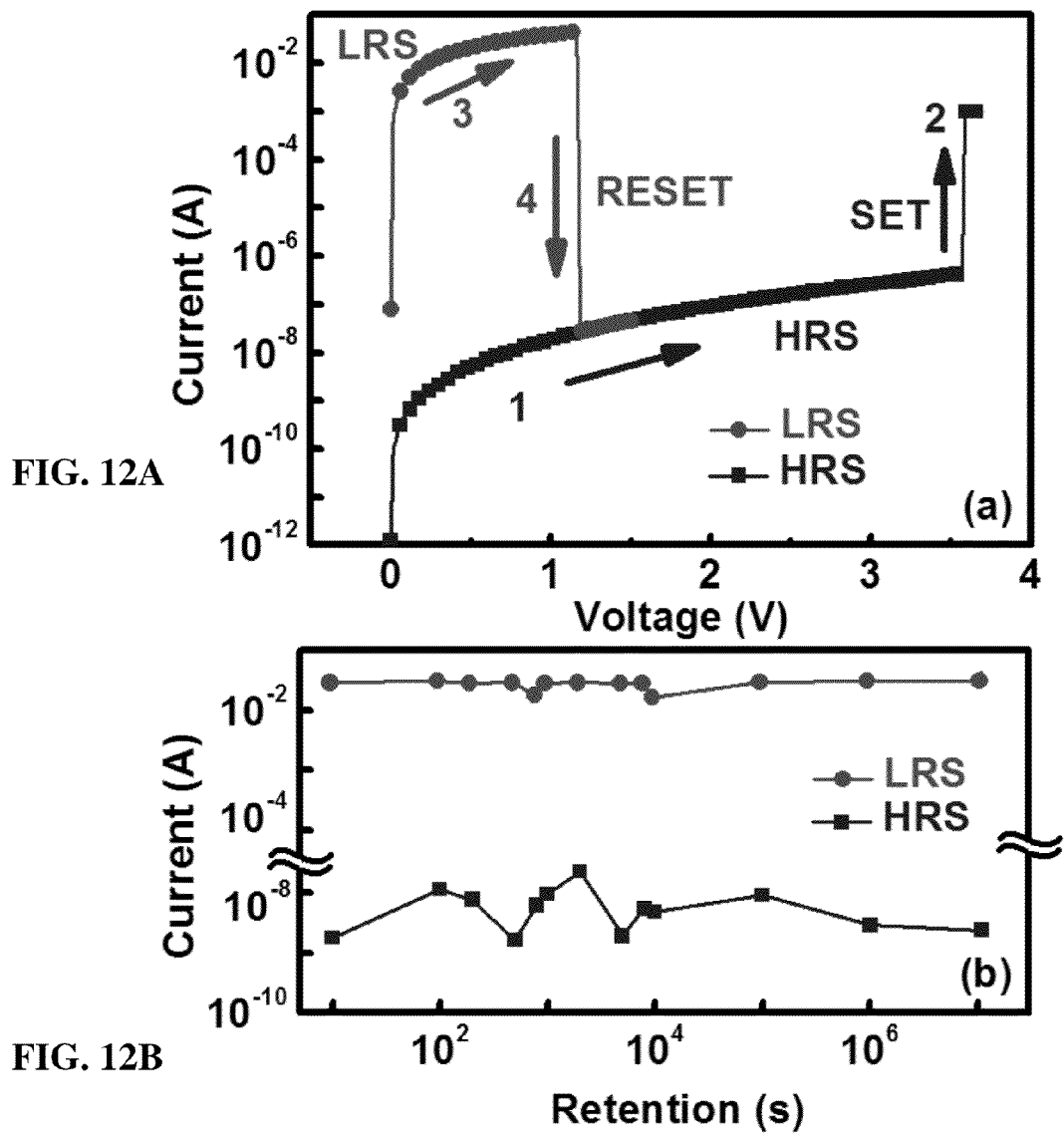
FIG. 12A shows the I-V characteristics of the FeZnO/MgO switching resistor. (b)
FIG. 12B shows the retention time of the FeZnO/MgO switching resistor.

FIG. 12A shows example I-V characteristics of an embodiment Pt/MgO/FeZnO/Au unipolar resistive switching structure. The resistance state of the device begins in HRS 1202. When the applied voltage reaches the SET region 1204, the device turns to LRS and remains in LRS 1206. When the voltage reaches the RESET voltage 1208, the resistive state switches back to HRS 1202. When the measured voltage reaches 1V, the $R_{HRS}/R_{LRS}$ ratio is 2.4×10$^6$. A retention time of 10$^7$ seconds may be obtained, as shown in FIG. 12B. Higher fluctuations in HRS compared to LRS are due to the different conduction mechanisms between HRS and LRS. It is noteworthy to mention that after eight months (~2×10$^7$ s) and more than 200 testing cycles, the $R_{HRS}/R_{LRS}$ ratio remained larger than 10$^5$.

Figure 13:
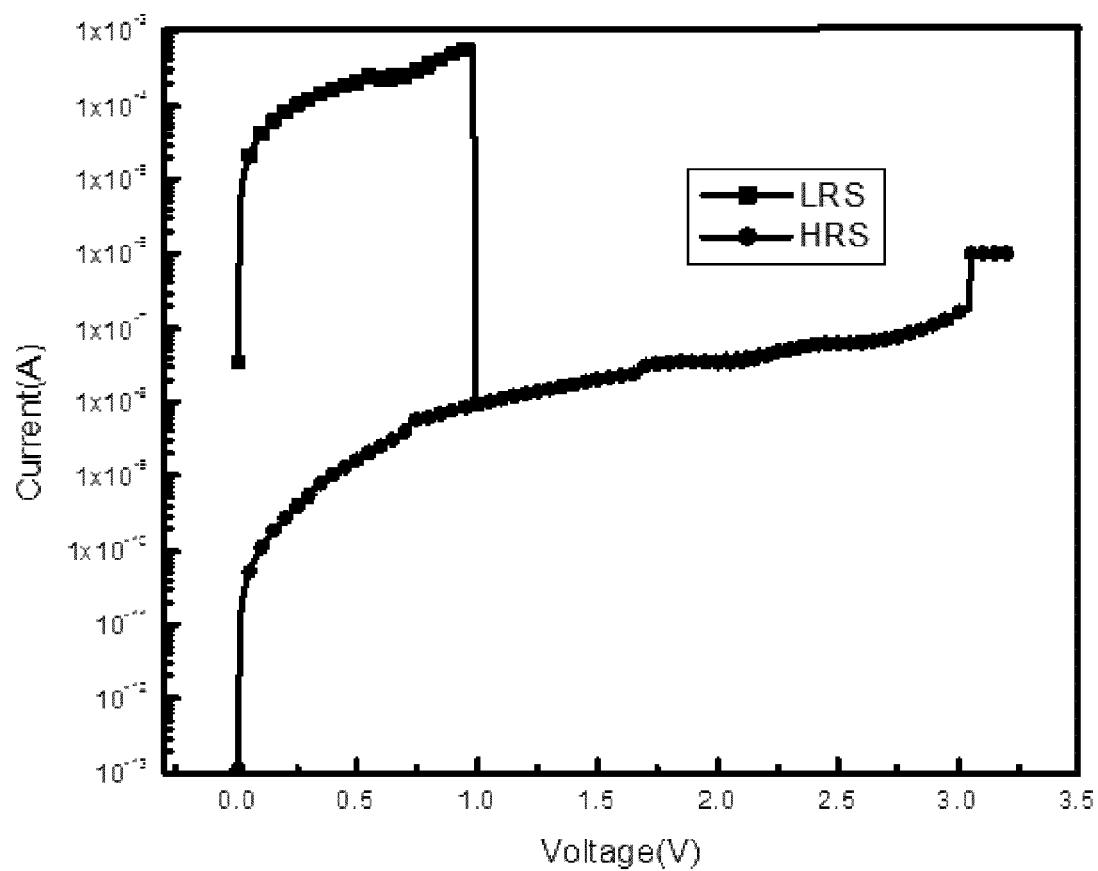
FIG. 13 shows the IV characteristics of the unipolar resistive switching with the compliance current of 1 μA.

The current density in the LRS can be tuned through a current limiter with different compliance currents for the switching resistor. For example, a current limiter setting to control the reset current, as well as the current density. FIG. 13 shows that using the same unipolar memory resistor (1R) as mentioned above. If the compliance current for the set step is reduced from 10 mA (the current case presented above) to 1 μA, the current density for LRS is reduced almost 2 orders (from 3.4×10$^3$ A/cm$^2$ to 4.8×10$^1$ A/cm$^2$). The $R_{HRS}/R_{LRS}$ ratio is also reduced from 2.4×10$^6$ to 9.4×10$^4$. Therefore, the current limiter can adjust the current density and resistance ratio according to different demands.

The I-V characteristics in LRS are fitted with a linear relation I=$a_1$ V in the log-log plot, where $a_1$=0.042 A/V, indicating good ohmic characteristics. The HRS curve is also fitted well to the equation from Poole-Frenkel emission (PFE) theory, as well as the unipolar memristor. From the curve fitting analysis, the resistive switching may result from the formation and rupture of the conducting paths composed by deep-level defects, such as oxygen vacancies ($V_o$), which serve as the positive charges according to the PFE model. In the FeZnO/MgO bilayer memory stack, the bonding energy of MgO is higher than that of ZnO, resulting in more difficulties in forming the $V_o$ in the MgO layer than in the FeZnO layer. By adding a MgO layer to form the FeZnO/MgO bilayer switching structure, the $V_o$ and related conducting filaments are suppressed, resulting in higher HRS and more uniform performance of the resistive switching.

Figure 14A:
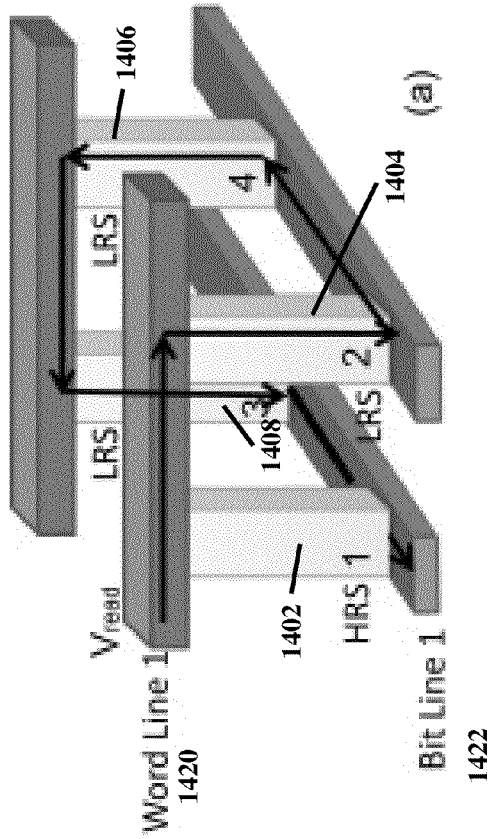
FIG. 14A illustrates reading malfunction in an array consisting of 2×2 resistive switching cells without diodes.

Unipolar resistive switching is dependent on the magnitude of applied voltage, and independent of the polarity of the bias voltage. In contrast, bipolar resistive switching occurs under the applied voltages with different polarities. Unipolar resistive switching device, under the opposite bias polarities, the IV characteristics show the near-symmetric curves. The crossbar array structure is widely used for high-density storage and reconfigurable electronics. When the memory resistor (R) serves as the unit cell in the 1R-only crossbar array architecture, a malfunction occurs. In a crossbar array, during reading process, a parasitic current can easily flow through the nearby R cells in LRS, thus causes the fake reading signals. For example, referring to FIG. 14A, in an example 2×2 crossbar structure, bit 1402 is in HRS, while bits 1404, 1406, and 1408 are all in LRS. To read bit 1402, a voltage pulse is applied to world line 1420 while bit line 1422 is ground. In the ideal operation, no parasitic current can pass from word line 1420 to reach bit line 1422 and the readout signal of bit 1402 is in HRS. However, a parasitic current path consisting of nearby bits in LRS can allow current to pass through bits 1404, 1406, and 1408 in LRS to reach bit line 1422. A fake readout signal of LRS for bit 1402 is therefore obtained.

Figure 14B:
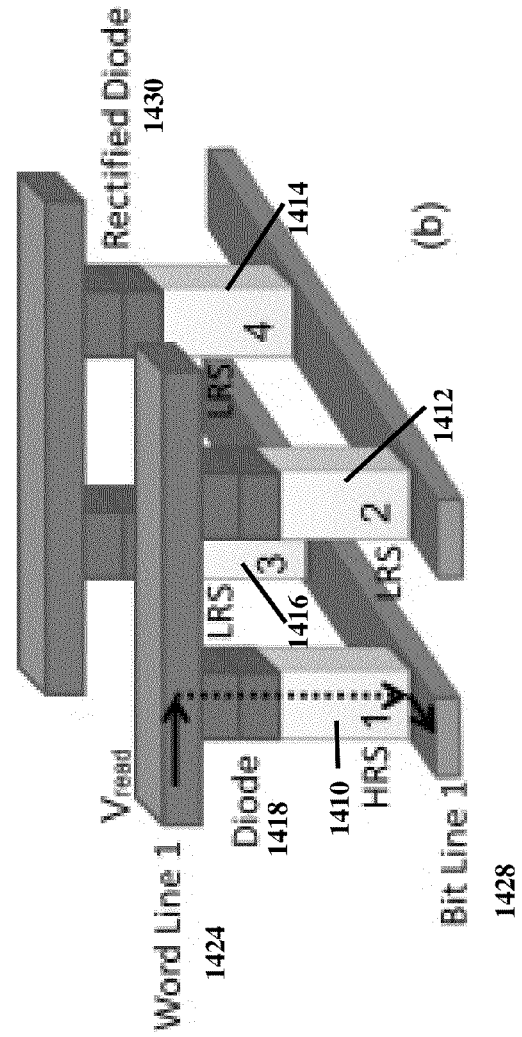
FIG. 14B illustrates rectified reading operation in an array consisting of 2×2 cells with diodes.

To eliminate the parasitic path, a diode 1418, 1430 has to be added to form the 1D1R unit cell in this 2×2 crossbar structure, as shown in FIG. 14B. When positive reading voltage is applied on the bit 1410, the diode 1430 in bit 1414 will be under a reverse bias, this integrated diode will block the current flowing through the nearby bits in LRS to reach bit line 1428 (except the extremely small leakage current flowing through the reverse-biased diode 1418). Thus, the reading signals will be acquired correctly. Therefore, in a crossbar matrix, it is needed to integrate a diode (1D) with a memory resistor (1R) to form the 1D1R unit cell to achieve the resistive switching without the crosstalk.

Figure 6:
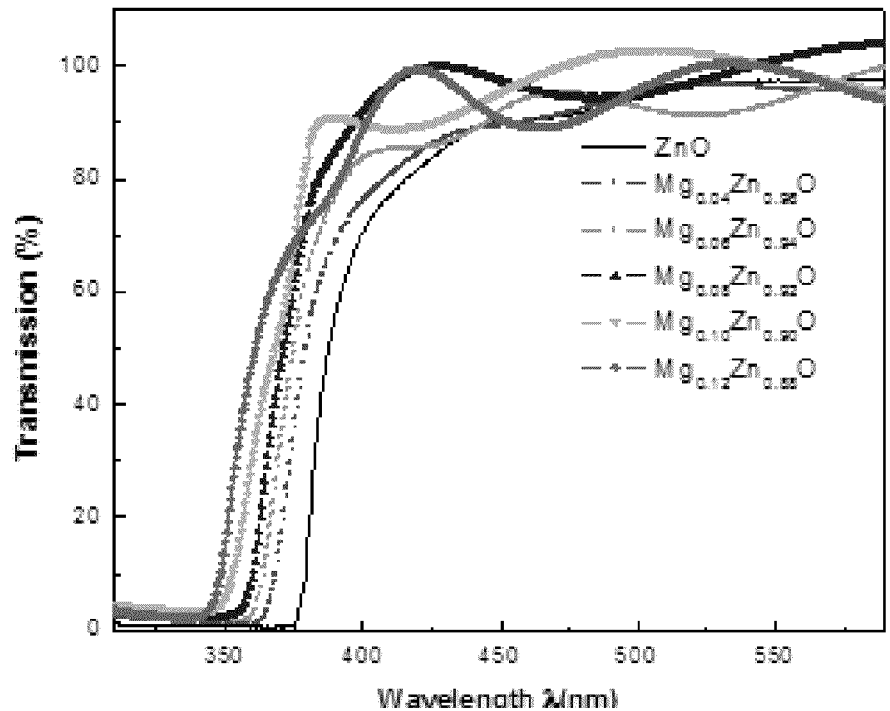
FIG. 6 shows transmission spectra of $Mg_xZn_{1-x}O$ films with different x.

To fabricate an embodiment of a 1D1R structure, a $SiO_2$ thin film (300 nm) is thermally grown on a Si substrate. The ZnO-based 1D1R component, including a Au/FeZnO/MgO/Pt structure as a unipolar switching resistor and a Ag/MgZnO/GaZnO/Au structure as a Schottky diode, is shown in FIG. 6. The vertical structure is chosen as it is preferred for 3-dimensional (3-D) integration. Pt was used as a bottom electrode for the resistor. To improve adhesion, 5 nm of Ti was deposited first on $SiO_2$, followed by a 100-nm of Pt deposited using e-beam evaporation. MgO (5 nm) and $Fe_{0.04}Zn_{0.96}O_x$ (70 nm) layers were deposited on Pt by metal-organic chemical vapor deposition (MOCVD). Au was deposited and patterned as the top electrode of the switching resistor and also as the bottom electrode for the diode. A Ga-doped ZnO (GZO) thin layer (10-nm) was deposited on top of the Au layer to serve as the n+ layer to achieve the ohmic contact. Then $Mg_{0.06}Zn_{0.94}O_x$ (350 nm) was deposited by MOCVD, and a Au/Ag layer formed the Schottky contact onto it. The diameters of the top and bottom electrodes of the diode are 40 and 60 μm, respectively. A Zeiss Leo Field Emission scanning electron microscopy (FESEM) was used to inspect the surface morphology and layer structures. The I-V characterization was conducted with an Agilent 4156C semiconductor parameters analyzer in the voltage sweeping mode.

The layer structure of an embodiment vertical Schottky diode is Ag/MgZnO/GaZnO/Au. In an embodiment of the integrated 1D1R structure, Au is the common electrode which serves as the top electrode for the switching resistor (R) and also as the bottom electrode to form the ohmic contact for the Scottky diode (D). Generally, Au is not a good choice for the ohmic contact in the discrete ZnO diode due to its high work function value. In order to form the ohmic contact between Au and ZnO, the field emission (FE), i.e. tunneling mechanism should dominate the current transportation. A highly Ga-doped ZnO (GZO) thin layer is deposited on the Au to serve as the n+-GaZnO layer to realize the ohmic contact in the n-MgZnO/n+-GaZnO/Au structure.

It is well known in the ZnO research society that Ag forms good Schottky contact to ZnO. The low work function metals, such as In, Al and Ti, yield low $\Phi SB$'s with the exception of Ag. Ag oxidizes easily, producing high barrier heights that depend on the degree of oxidation. In the current work, we also have found that Ag forms better Schottky contacts with MgZnO in comparison to Pt, Au and other metal schemes. We chose the MgZnO instead of ZnO as the semiconductor material to form the Schottky diode. We have found that the Mg-doped ZnO (MgZnO) contains less oxygen vacancies, leading to the low leakage current in the Schottky diode. Furthermore, MgxZn1-xO (x~5%) possesses better thermal stability than the pure ZnO.

Figures 15A, 15B:
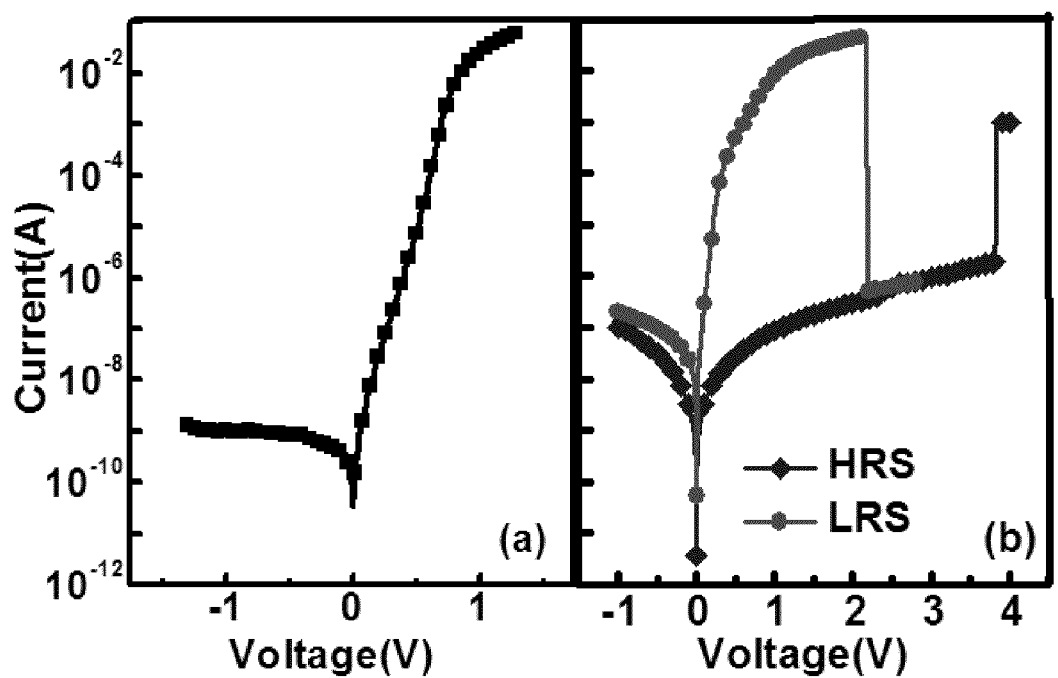
FIG. 15A shows the I-V characteristics of the MgZnO Schottky diode.
FIG. 15B shows the I-V characteristics of the vertically integrated ZnO-based 1D1R switching device.

Shown in FIG. 15A are the I-V characteristics of an example, Ag/MgZnO/GaZnO/Au diode, where the forward/reverse current ratio at 1V is $2.4 \times 10^7$. $Mg_{0.06}Zn_{0.94}O_x$ is chosen to make the diode over the pure ZnO to suppress the oxygen vacancy, and allowing for a smaller reverse current. Ag forms a Schottky contact to ZnO. In the current case, Ag may oxidize easily into $AgO_x$ during the contact formation, producing a high barrier height with MgZnO. In FIG. 15B, for the integrated 1D1R device, bistable resistive switching is observed under the forward bias; while the current is suppressed under the reverse bias. The $R_{HRS}/R_{LRS}$ ratio at 1V is $9.4 \times 10^4$, while the forward/reverse current ratio at $\pm 1V$ is $4.1 \times 10^4$. The RESET and SET voltage regions of the 1D1R are 1.53 V to 2.98 V and 3.64 V to 7.21 V, respectively. In comparison with the single 1R device, both the SET and RESET voltages in the 1D1R device are increased slightly. This could be introduced from the resistance of the diode. The large differences of the $R_{HRS}/R_{LRS}$ and forward/reverse current ratios demonstrate that the integrated ZnO 1D1R structure is useful for memory control without the fake switching and crosstalk that commonly occur in the 1R crossbar array. The reverse current in the ZnO 1D1R is larger than that in a single diode, mainly due to the difference in the contact morphology between the integrated and discrete diodes.

In addition to Fe-doped ZnO, the other transitional metal (TM) doped ZnO, the other oxide materials including but not limited to HfO2, TiO2, Ta2O5, etc, and the polymer materials can also be used to make the resistive switching devices on the glass substrates.

$Mg_xZn_{1-x}O$ film is also used as a channel layer in thin film transistors (TFT), where Mg substitution increases the activation energy for defect-related donor states by increasing the band gap and thus reduce the carrier density in the ZnO channel layer. This achieves an enhancement mode TFT devices. Moreover, MgxZn1-xO alloy could enlarge the band tail states by increasing the energy gab, $E_g$ of ZnO, also referred to as the bandgap, and improve the stability of TFT performance under visible light.

Zinc oxide thin film transistors (TFTs) are recently emerging as next generation active devices on glass substrates. A 1T1R ZnO nanotip switching matrix is described herein. The nano-ZnO 1T1R structure can be deposited on Si and glass substrates for various applications. In each 1T1R cell, a ZnO TFT can serve as an addressing element, and a thin layer of FeZnO memristor, as described above, will be used as a bistable resistive switch. In addition, ZnO based TFT technology can be suitable for the UV sensing. In comparison to traditional photoconductivity based MIM UV sensors, additional metal electrodes (gate) provide functions including tunable control of readout time and internal gain of UV sensing.

$Mg_xZn_{1-x}O$ polycrystalline films for thin film transistors (TFTs) have been developed using the MOCVD technique. The substrate temperature can be optimized at 400° C.~450° C., a little lower than that for diodes. Additionally, a high $O_2$/DEZn flow rate ratio and in-situ annealing can be utilized to control the doping level of $Mg_xZn_{1-x}O$ polycrystalline films for enhancement-mode TFTs. Different Mg contents can be achieved through adjusting the $MCp_2Mg$/DEZn flow rate ratio. Additionally, better control of Mg contents and intrinsic doping levels can optimize the growth conditions. The effects of Mg contents (e.g., x=6% and 10%) on the electrical characteristics and thermals stability of $Mg_xZn_{1-x}O$ TFTs are correlated to the growth conditions. In an embodiment, the compound used for TFT applications is $Mg_{0.06}Zn_{0.94}O$. This compound provides optimized I-V characteristics, thermal stability and biasing stress stability.

ZnO TFTs as described herein include a number of advantageous characteristics. Reduced background doping concentration is provided by optimizing the annealing process to achieve Enhancement Mode TFTs for low power operation, which benefits integration. The structures described herein have reduced defect density in the channel and improved gate dielectric quality to obtain high mobility (from 28 $cm^2$/V-s to 48 $cm^2$/Vs), low subthreshold swing (from 1.2 V/dev to 390 mV/dec) and large current on-off ratio (from $>10^8$ to $>10^{10}$). $Mg_{0.06}Zn_{0.94}O$ TFT exhibits better I-V characteristics and thermal stability due to the suppression of oxygen vacancy related defects. Both positive bias stress stability (PBS) and negative bias stress (NBS) can be improved after doping 6% Mg into ZnO channel to form $Mg_{0.06}Zn_{0.94}O$ TFT.

An enhancement-mode field effect transistor (FET) is preferred due to its low power consumption and the normally off state at zero bias. The problems associated with fabrication of enhancement mode ZnO TFTs include: (i) high intrinsic carrier concentration of ZnO channel layer from defects and (ii) presence of large density trap states at the $ZnO/SiO_2$ interface. As a result, an electron conduction layer can be formed in the channel region even none of gate voltage is applied.

Figures 16A, 16B:
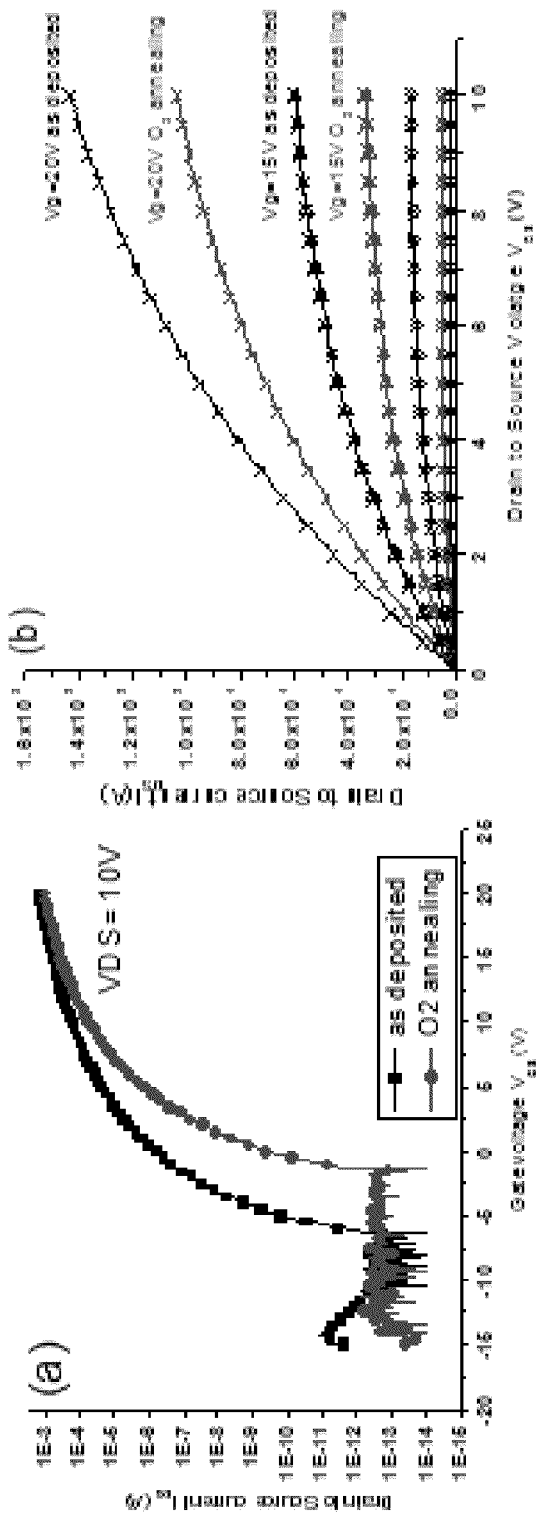
FIG. 16A shows the I-V characteristics of as-deposited and $O_2$ annealed ZnO TFTs with $V_{DS}$=10 V, $V_{GS}$ sweeping from −20 V to 20 V.
FIG. 16B shows the I-V characteristics of as-deposited and $O_2$ annealed ZnO TFT where Vgs sweeps from 0V to 20V at 5 V/div and $V_{DS}$ sweeps from 0 to 10 V.

With continuous improvement on growth condition of ZnO channels, performance ZnO TFTs is increased as shown in FIGS. 16A and 16B. FIG. 16A shows the $I_{DS}$-$V_{GS}$ characteristics of as-deposited and $O_2$ annealed ZnO TFTs with $V_{DS}$=10 V and $V_{GS}$ sweeping from −20 V to 20 V. FIG. 16B shows the $I_{DS}$-$V_{DS}$ characteristics of as-deposited and $O_2$ annealed ZnO TFT where $V_{GS}$ sweeps from 0V to 20V at 5 V/div and $V_{DS}$ sweeps from 0 to 10 V. The as deposited ZnO TFT shows threshold voltage of 2V, subthreshold swing of 0.65V/dec and field effect mobility of 35 $cm^2$/Vs. After annealing at 600° C. for 1 hr in $O_2$ ambient, the ZnO TFT shows threshold voltage of 10 V, subthreshold swing of 0.4 V/dec and field effect mobility of 38 $cm^2$/Vs. The decrease of subthreshold swing after annealing in $O_2$ ambient indicates that less defects existing within ZnO channel or less interfacial defects lying between interface of ZnO and $SiO_2$. Both deep gap states and band tail states decrease after annealing in $O_2$ ambient, leading to better device performance.

A technology computer aided design (TCAD) device simulation can be used to calculate TFT characteristics and to estimate the subgap density of states (DOS). The Shockley-Read-Hall (SRH) recombination model can be used as the basis and the trapping model takes into account both deep level traps due to grain boundaries and band tail states due to the non-negligible amorphous volume ratio. The summary of the simulated results and experimental results are listed in FIG. 17. With the aid of the device simulator, we are able to extract the Gaussian distributed deep gap states and exponential distributed tail states by fitting the experimental data into the device models.

In order to improve ZnO TFT performance, the suppression of oxygen vacancy in ZnO channel layer is important. The formation of oxygen vacancy releases the free electrons increasing the background carrier concentration, and resulting in a normally-on characteristic of ZnO TFTs. Device performance is also degraded due to the trapping of carriers originating from oxygen vacancy.

Mg has a much lower standard electrode potential ($E°=-2.37$ eV) than Zn ($-0.76$ eV). Moreover, the incorporation of Mg into ZnO film can increase the energy gap, leading to a drop of donor related levels toward the deep or intrinsic levels. Deep level defects related to oxygen vacancies can be suppressed after incorporation of Mg into ZnO film. Therefore, TFT performance is significantly improved after incorporation of Mg. The summary of device performance for both ZnO TFT and $Mg_{0.06}Zn_{0.94}O$ TFT is listed in the Table 1.

TABLE 1

Summary of device performance for ZnO TFT and $Mg_{0.06}Zn_{0.94}O$ TFT.

|  | ZnO | $Mg_{0.06}Zn_{0.94}O$ |
|---|---|---|
| Current on-off ratio | >$10^8$ | >$10^{10}$ |
| Threshold voltage | 5 V | 6 V |
| Field effect mobility | 30 cm$^2$/V-s | 40 cm$^2$/V-s |
| Subthreshold slope | 0.75 V/dec | 0.25 V/dec |

The field effect mobility increases from 35 cm$^2$/Vs to 48 cm$^2$/Vs and the subthreshold swing decreases from 0.75 V/dec to 0.36 V/dec after doping with Mg. Higher field effect mobility and lower subthreshold swing both indicate that the improvement of ZnO channel properties is achieved after doping with Mg.

Figure 18:
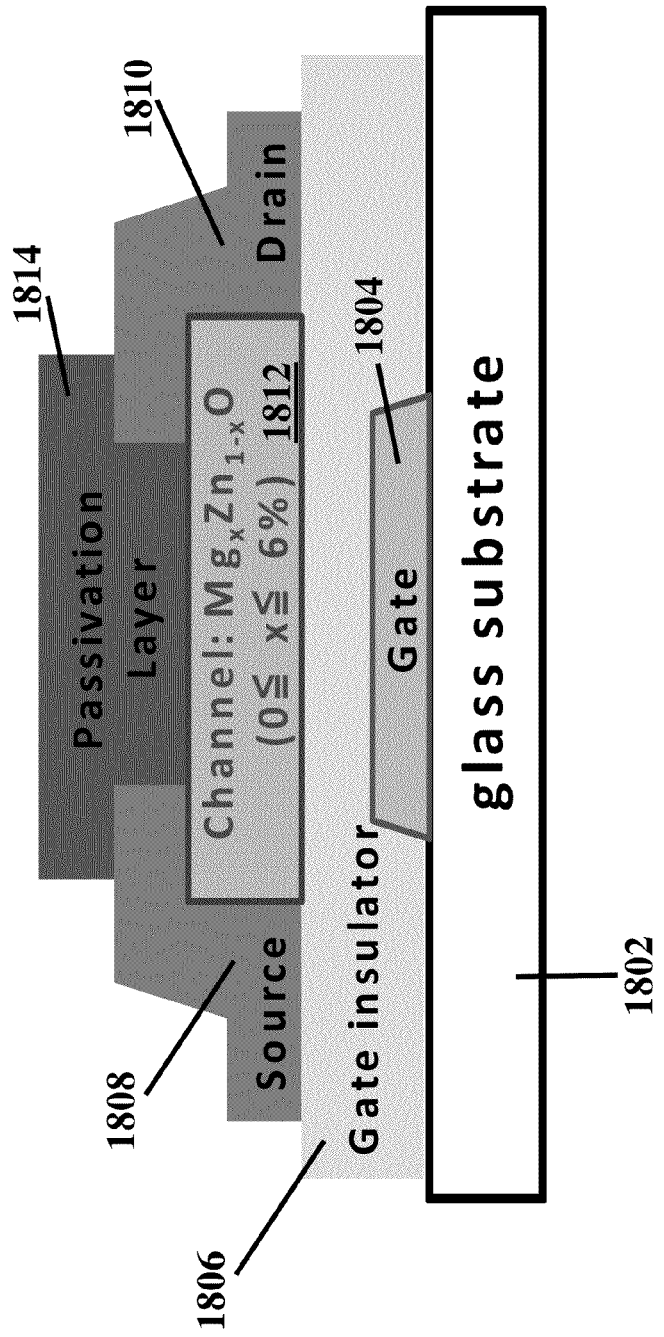

$Mg^{2+}$ ions can be incorporated to prevent oxygen out-diffusion and hinder the formation of oxygen vacancies in the TFT channel. The Mg composition is limited to no more than 10% to minimize deterioration of the field effect mobility. FIG. 18 shows an embodiment of a ZnO TFT. The structure of FIG. 18 includes a substrate 1802, a gate electrode 1804, a gate insulator or dielectric 1806, a source 1808, a drain 1810, a ZnO channel layer 1812, and a passivation layer 1814. Bottom gate $Mg_xZn_{1-x}O$ TFTs were fabricated on heavily-doped n-type Si wafers with a 100 nm thermally grown $SiO_2$. The 50 nm—$Mg_xZn_{1-x}O$ (x=0, 0.06 and 0.10) channels are grown by metal-organic chemical vapor deposition (MOCVD) at 450° C. DEZn (diethyl zinc) and $MCp_2Mg$ (bis(methylcyclo-pentadienyl)magnesium) can be the precursors for Zn and Mg, respectively. The source 1808 and drain 1810 metallizations can be formed with 100 nm Ti/50 nm Au by a lift-off process. The active layer is fixed at a width/length (W/L)=150 µm/5 µm. To prevent ambient absorption/desorption during the electrical testing, a SU-8 photoresist is coated on top of the TFT channel, serving as a passivation layer 1814.

The field effective mobilities of these three TFTs are extracted from the linear region. All of the TFTs have high on-off ratios (>$10^9$). The extracted threshold voltages ($V_{th}$) for ZnO, $Mg_{0.06}Zn_{0.94}O$, and $Mg_{0.1}Zn_{0.9}O$ TFTs are 2.1V, 3.5V, and 4.5V, respectively. For the ZnO TFT, a field effect mobility µFE of 30 cm$^2$/V-s and a subthreshold swing S of 0.54V/dec are obtained. Severe degradation of mobility ($\mu_{FE}=8$ cm$^2$/V-s) and subthreshold swing (S=1.9V/dec) is observed for the $Mg_{0.1}Zn_{0.9}O$ TFT, resulted from alloying disorder and an increased effective mass of the electrons. However, in contrast to the high Mg composition (10%) case, the $Mg_{0.06}Zn_{0.94}O$ TFT shows the highest field effect mobility ($\mu_{FE}=40$ cm$^2$/V-s) and lowest subthreshold swing (S=0.25V/dec). A decrease in bulk trap density indicates that the electron traps associated with oxygen vacancies in the ZnO channel are reduced after alloying of 6% Mg to form $Mg_{0.06}Zn_{0.94}O$.

Figures 19A, 19B:
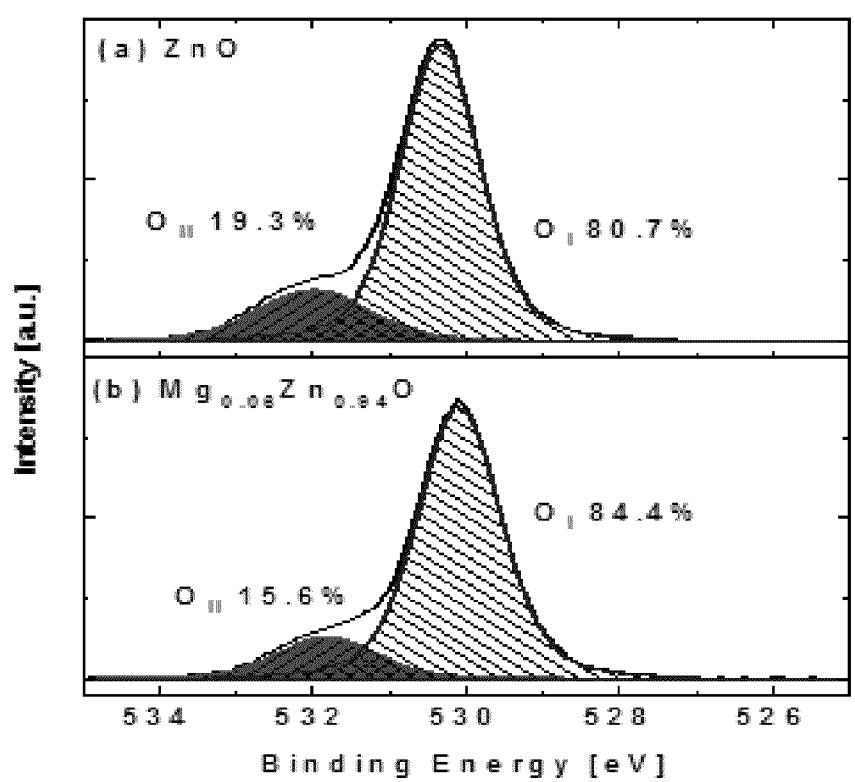
FIG. 19A shows the $O_{1s}$ peaks in the XPS spectra of pure ZnO channel layers.
FIG. 19B shows the $O_{1s}$ peaks in the XPS spectra of $Mg_{0.06}Zn_{0.94}O$ channel layers.

FIGS. 19A and 19B show $O_{1s}$ peaks in x-ray photoelectron spectroscopy (XPS) spectra of ZnO and $Mg_{0.06}Zn_{0.94}O$ thin films, respectively. Gaussian fitting is used in the deconvolution of these $O_{1s}$ peaks. The peak at the lower binding energy ~530 eV (OI) is attributed to $O_2$-ions present in a stoichiometric wurtzite ZnO structure, whereas the peak at the higher binding energy ~532 eV ($O_{II}$) has been attributed to $O_2$-ions in "oxygen deficient" ZnO. The ratio of peak area ($O_{II}/O_{tot}$), indicating the relative quantity of this oxygen-related defect, is reduced from 19.3% (for ZnO) to 15.6% (for $Mg_{0.06}Zn_{0.94}O$) after 6% Mg is alloying into the ZnO thin film. Also, the $O_I/O_{II}$ peak positions shifted to lower binding energies from 530.32/532.08 eV to 530.08/531.80 eV due to a decrease in the number of oxygen vacancies.

Both TFTs exhibit a negatively shifted threshold voltage $V_{th}$ with increasing temperature: $\Delta V_{th}$ of ZnO TFT and $Mg_{0.06}Zn_{0.94}O$ TFT are 1.5 V and 0.5V, respectively. The subthreshold drain current of ZnO TFT increases from 2.2× $10^{-10}$ A to 8.6×$10^{-8}$ A with a $V_{GS}$ of −2V. In contrast to the ZnO TFT, the subthreshold drain current of $Mg_{0.06}Zn_{0.94}O$ TFT only increases from 2.3×$10^{-10}$ A to 8.0×$10^{-9}$ A with a $V_{GS}$ of 1.5V. Under a negative gate voltage, neutral oxygen vacancies ($V_o$) in the depletion region of ZnO channel can be thermally excited to ionized state ($V_o^{2+}$). Ionized oxygen vacancies would release electrons into the conduction band. The higher channel conductivity and lower $V_{th}$ are induced by the formation of ionized oxygen vacancies. A simulation of the depletion width for deep traps at high concentration shows that with a negative gate voltage of 5V, the entire channel of the ZnO TFT can be fully depleted under the assumption of trap density $N_T=10^{16}$ to $10^{18}$ cm$^{-3}$.

The activation energy of the drain current extracted from an Arrhenius plot is used to approximately track the position of Fermi level ($E_A=E_C-E_F$) in the bandgap. The activation energy (EA) of the drain current is a function of $V_{GS}$. The maximum activation energy of ZnO TFT is 0.85 eV while for $Mg_{0.06}Zn_{0.94}O$ TFT it is 1.15 eV. The increase of activation energy of $Mg_{0.06}Zn_{0.94}O$ TFT can not be explained only by the increase of the energy bandgap since the optical bandgap only increases by ~0.15 eV. The higher energy barrier of $Mg_{0.06}Zn_{0.94}O$ TFT may result from the stronger bonding of Mg—O as compared to Zn—O, meaning that the formation of oxygen vacancies is suppressed and the density of oxygen vacancies is also reduced. In addition, the activation energy ($E_A$) of the $Mg_{0.06}Zn_{0.94}O$ TFT decreases faster as a function of $V_{GS}$. The falling rate of $E_A$ with respect to $V_{GS}$ is correlated to the filling of traps in the active layer and the gate insulator/active layer interface. For a TFT with a large trap density ($N_{tot}$), the decrease of $E_A$ with $V_{GS}$ is approximately inversely proportional to the $N_{tot}$. Because all TFTs are fabricated on the same thermally grown $SiO_2$/Si film, it can be presumed that most of the contribution of $N_{tot}$ comes from bulk trap density (NBS) of the channel. The faster decrease of $E_A$ (0.9 eV/V) with respect to $V_{GS}$ in the $Mg_{0.06}Zn_{0.94}O$ TFT compared to ZnO TFT (0.3 eV/V) suggests that the $N_{tot}$ in $Mg_{0.06}Zn_{0.94}O$ TFT is diminished by roughly 3 times relative to a ZnO TFT. This inference is consistent with the value of NBS extracted from the subthreshold slope. Thus, the improved thermal stability and electrical characteristics of $Mg_{0.06}Zn_{0.94}O$ TFT can be mainly attributed to a reduced density of oxygen vacancies and the associated electron traps by incorporation of Mg ions into ZnO.

The positive bias stress stability testing was conducted on ZnO and $Mg_{0.06}Zn_{0.94}O$ TFTs with a gate voltage of +20V for different time (from 1 hour up to four hours). After bias stress was applied, I-V transfer characteristics were measured under a drain voltage of 10V. Both ZnO and $Mg_{0.06}Zn_{0.94}O$ TFTs exhibit positive shifts of I-V transfer curves after positive bias stress. The shift of threshold voltage ($\Delta V_{th}$) for ZnO and $Mg_{0.06}Zn_{0.94}O$ TFTs are 1.54 and 1.45V, respectively. The positive shift of transfer curves can be attributed to the charge trapping (electrons) at the interface between gate dielectric layer and ZnO/$Mg_{0.06}Zn_{0.94}O$ channel layers.

The positive bias stress stability testing was conducted on ZnO and $Mg_{0.06}Zn_{0.94}O$ TFTs with a gate voltage of –20V for different time (up to 1 hour). After bias stress was applied, I-V transfer characteristics were measured under a drain voltage of 10V. Both ZnO and $Mg_{0.06}Zn_{0.94}O$ TFTs exhibit negative shifts of I-V transfer curves after positive bias stress. The shift of threshold voltage ($\Delta V_{th}$) for ZnO and $Mg_{0.06}Zn_{0.94}O$ TFTs are –4.59V and –2.07V, respectively. The negative shift of transfer curves can be attributed to the generation of ionized oxygen vacancies and then subsequently trapped at the interface between gate dielectric layer and ZnO/$Mg_{0.06}Zn_{0.94}O$ channel layers. Owing to suppression of oxygen related defects in $Mg_{0.06}Zn_{0.94}O$ TFTs, less shift of $\Delta V_{th}$ is observed. Thus, bias stress stability is improved after doping of Mg into ZnO channel.

The shift of threshold voltage versus stress time can be fitted into the stretch-exponential model. In stretch-exponential model, the shift of threshold voltage is attributed to the charge generation and charge diffusion toward the interface. The shift of threshold voltage with stress time can be described by the following equation:

$$|\Delta V_{th}| = |\Delta V_o|^\alpha - |\Delta V_o|^\alpha e^{-(\frac{t_{stress}}{\tau})^\beta} \quad \text{(Equation 3)}$$

where the $\Delta V_0$ is the effective voltage drop across the gate insulator, $t_{stress}$ is the stress time, $\tau$ is the characteristic trapping time of carriers, $\alpha$ is the exponent for $\Delta V_0$ dependence and $\beta$ is the stretched exponential exponent. The values of $\tau$ for ZnO and $Mg_{0.06}Zn_{0.94}O$ TFTs under negative bias stress testing are $7.81 \times 10^3$ and $1.82 \times 10^5$ sec, respectively. Larger $\tau$ of $Mg_{0.06}Zn_{0.94}O$ TFT indicates that the energy barrier to generation carriers is higher, therefore, the superior bias stress stability is achieved. The improvement of negative bias stress stability may be attributed to the suppression of oxygen vacancy related defects after incorporation of 6% Mg into ZnO channel. Oxygen vacancy is neutral ($V_O$) as the Fermi level is closed to conduction band minimum, while it becomes positive charged ($V_O^{2+}$) as the Fermi level moves toward valence band minimum. Applying the negative bias on the gate electrode depletes the electrons in the channel, moving Fermi level toward the valence band minimum. In this case, the neutral oxygen vacancy becomes thermodynamically unstable, therefore, releasing electrons to form ionized oxygen vacancy. The ionized oxygen vacancy may also move toward gate dielectric/channel interface and become trapped at dielectric/channel interface. The introduction of Mg into ZnO can suppress the formation of oxygen vacancy related defects due to larger Mg—O bonding energy. Therefore, the larger characteristic trapping time is obtained in $Mg_{0.06}Zn_{0.94}O$ TFT.

In an embodiment, the 1T1R structure forms a reconfigurable non-volatile memory platform in CMOS/ZnO reconfigurable integrated system. The nano-ZnO 1T1R structure will be deposited on Si and glass substrates for various applications. In each 1T1R cell, ZnO film TFT will serve as an addressing element, and a thin layer of FeZnO memristor will be used as a bistable resistive switch. Natural integration of 1T1R cell can be either vertical or horizontal due to the same material system (both from ZnO). The Set/Reset voltage of memristor and turn on voltage of Transistor will be tuned to fit in conventional CMOS technology (5V) through optimization of fabrication processing.

Both T and R devices are made from ZnO, such 1T1R configuration can be integrated vertically. Depending on thermal budget of processing, either T or R can be built on glass/flexible substrates first (T-first 1T1R, shown in FIG. 20 or R-first 1T1R, shown in FIG. 21) while the other element can integrated vertically later. For example, if thin film transistor is built before the fabrication of bipolar resistive switching device, it is a T-first configuration. In addition, such 1T1R array has superior immunity to circuit noise since the change of resistance state is not only dependent on the amplitude but also the polarity of electrical signal. Such 1T1R array provide a non-volatile memory with reconfigurable functionality which can be utilized analog and digital signal processing circuits, imaging sensors and display systems.

Figure 20:
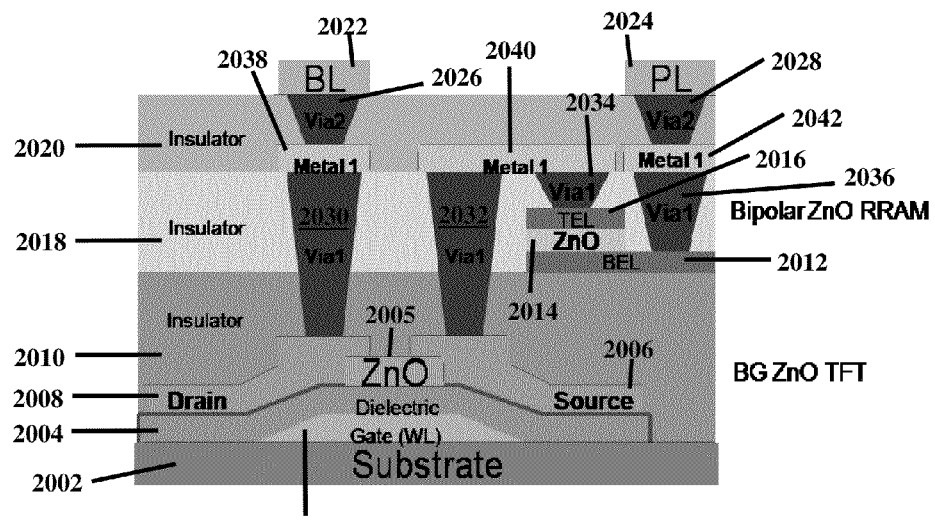
FIG. 20 shows the cross section schematics of an embodiment of a "T-first" ZnO 1T1R cell.

FIG. 20 illustrates an embodiment of a "T-first" ZnO 1T1R cell. The ZnO TFT is deposited on the substrate 2002 and includes a gate electrode 2003, a dielectric layer 2004, a source 2006 and drain 2008, and the ZnO channel layer 2005. The gate electrode of the ZnO TFT can be used as a word line (WL). The Bipolar ZnO RRAM includes a bottom electrode 2012, a top electrode 2016, and a ZnO layer 2014 disposed between the bottom electrode 2012 and top electrode 2016. Also included in the structure are insulator layers 2010, 2018, 2020, bit line (BL) 2022, plate line (PL) 2024, via contacts 2026, 2028, 2030, 2032, 2034, 2036, and metal contacts 2038, 2040, and 2042.

Figure 21:
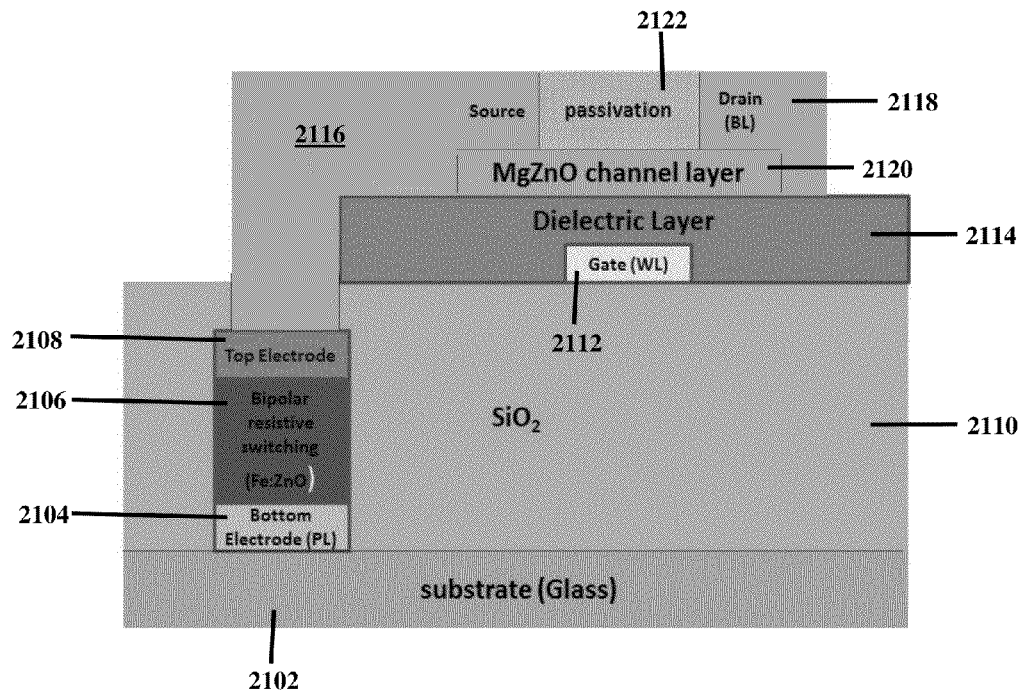
FIG. 21 shows the cross section schematics of an embodiment of a "R-first" ZnO 1T1R cell.

FIG. 21 illustrates a vertically integrated "R-first" ZnO 1T1R structure wherein the memristor is deposited directly on the substrate 2102. The memristor structure includes bottom electrode (PL) 2104, a ZnO layer 2106, and a top electrode 2108. A layer of $SiO_2$ is deposited around the memristor structure. A ZnO TFT is deposed on the $SiO_2$ layer and includes a gate electrode (WL) 2112, a dielectric layer 2114, a source 2116, a drain 2118, a ZnO channel layer 2120, and a passivation layer 2122.

An embodiment of a ZnO 1T1R non-volatile RRAM array includes a word line (WL), a bit line (BL) and a plate line (PL). In a single 1T1R configuration, the source 2006, 2116 of a ZnO TFT is connected to the top electrode 2016, 2108 of ZnO bipolar resistive switching device. The WL is connected to the gate electrode 2003, 2112 of a ZnO TFT. The BL is connected to the drain 2008, 2118 of a ZnO TFT. The PL is connected to the bottom electrode 2012, 2104 of ZnO bipolar resistive switching device. To write a bit 0, the BL is grounded and pulses with different durations are applied both on the WL and the PL so that a negative bias voltage is applied to ZnO R. To read a bit 0, a constant voltage is first applied to WL to enable read function and a pulse (0V to $V_{dd}$) is later applied to PL while BL is grounded. Because previous resistance state is 0, such negative bias voltage cannot toggle the resistance state. Therefore, the voltage change across ZnO R will be lower than the reference voltage of sense amplifier. To write a bit 1, the PL is grounded and two pulses with different durations are applied on WL and BL so that a positive bias is built across the ZnO R. To read a bit 1, a constant voltage is first applied to WL to enable read function and a pulse (0V to $V_{dd}$) is later applied to PL while BL is grounded. Because previous resistance state is 1, the negative bias voltage across the ZnO R will toggle the resistance state back to 0, introducing a maximum voltage change larger than reference voltage of sense amplifier.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and script of the invention, and all such variations are intended to be included within the scope of the following claims.

We claim:

1. Integrated device components, comprising a vertically integrated reconfigurable and programmable diode/memory resistor (1D1R) structure built on a substrate, wherein 1D is a MgxZn1-xO Schottky diode, for which $0 \leq x \leq 0.06$, and 1R is a transition metal-doped ZnO unipolar resistive switching device comprising a first metal electrode deposited on the substrate, a transition metal-doped ZnO ternary compound and nanostructured thin film grown on the first metal electrode, and a second metal electrode deposited on the nanostructured thin film.

2. A vertically integrated diode/memory resistor (1D1R) device component, comprising:
   (a) a substrate;
   (b) a unipolar resistive switching device comprising a nanostructured thin film disposed between first and second metal electrodes, said nanostructured thin film comprising a transition metal doped ZnO ternary compound, wherein said first metal electrode is disposed on the substrate; and
   (c) a Schottky diode disposed on the resistive switching device comprising:
      (i) a nanostructured $Mg_xZn_{1-x}O$ thin film disposed on the second metal electrode of said resistive switching device, wherein $0 \leq x \leq 0.06$; and
      (ii) a third metal electrode disposed on the diode thin film.

3. The device component of claim 2, wherein said nanostructured thin film of said switching device comprising a transition metal doped ZnO ternary compound is a dual layer structure consisting of a Fe doped ZnO layer greater than ten urn thickness and a second oxide layer less than ten nm thickness comprising one or more oxides selected from the group consisting of MgO, $Al_2O_3$, $HfO_2$, $Ta_2O_5$, NiO, $TiO_2$, $SiO_2$, $Nb_2O_5$, $ZrO_2$, CoO, $SnO_2$, $Ga_2O_3$ and $SrTiO_3$.

4. The device component of claim 3, wherein said second oxide layer consists essentially of MgO.

5. The device component of claim 2, wherein the first metal electrode comprises Pt and the second metal electrode comprises Au.

6. The device component of claim 2, wherein the nanostructured ZnO film of said diode comprises a multilayer structure, consisting of a doped n-type ($n^+$) ZnO layer contacting the second metal electrode and said $Mg_xZn_{1-x}O$ semiconductor layer contacting the third metal electrode to form the Schottky contact.

7. The device component of claim 6, wherein the doped n-type ($n^+$) ZnO layer comprises Ga-doped ZnO (GZO), Al-doped ZnO (AZO) or In-doped ZnO (IZO) layers.

8. The device component of claim 2, wherein the third metal electrode is silver.

9. The device component of claim 2, wherein the substrate is selected from the group consisting of glass, flexible polymers, silicon (Si), silicon dioxide ($SiO_2$) covered Si (Si/$SiO_2$), and complementary metal oxide semiconductor (CMOS) wafer.

10. An integrated circuit comprising a crossbar array for switching matrices comprising the vertically integrated 1D1R structure of claim 2.

* * * * *